United States Patent
Pinkerton et al.

(10) Patent No.: US 12,273,694 B2
(45) Date of Patent: Apr. 8, 2025

(54) VOICE COIL ACTUATOR AND LOUDSPEAKERS CONTAINING SAME

(71) Applicant: Clean Energy Labs, LLC, Austin, TX (US)

(72) Inventors: Joseph F. Pinkerton, Austin, TX (US); David A. Badger, Lago Vista, TX (US)

(73) Assignee: Brane Audio, LLC, Austin, TX (US)

( * ) Notice: Subject to any disclaimer, the term of this patent is extended or adjusted under 35 U.S.C. 154(b) by 205 days.

(21) Appl. No.: 18/008,031

(22) PCT Filed: Jun. 4, 2021

(86) PCT No.: PCT/US2021/035883
§ 371 (c)(1),
(2) Date: Dec. 2, 2022

(87) PCT Pub. No.: WO2021/247986
PCT Pub. Date: Dec. 9, 2021

(65) Prior Publication Data
US 2023/0239625 A1 Jul. 27, 2023

Related U.S. Application Data

(60) Provisional application No. 63/034,556, filed on Jun. 4, 2020.

(51) Int. Cl.
*H04R 29/00* (2006.01)
*H03F 3/183* (2006.01)
(Continued)

(52) U.S. Cl.
CPC .............. *H04R 9/046* (2013.01); *H03F 3/183* (2013.01); *H04R 1/025* (2013.01); *H04R 7/04* (2013.01);
(Continued)

(58) Field of Classification Search
CPC .......... H04R 9/046; H04R 1/025; H04R 7/04; H04R 9/025; H04R 9/06; H04R 29/003;
(Continued)

(56) References Cited

U.S. PATENT DOCUMENTS 9,826,313 B2 11/2017 Pinkerton et al.
2018/0332376 A1* 11/2018 Lee ................ H04R 1/028

FOREIGN PATENT DOCUMENTS

EP 0137550 A1 4/1985
EP 2023657 A2 2/2009
(Continued)

OTHER PUBLICATIONS

International Searching Authority, International Search Report and Written Opinion for PCT/US2021/035883, date of mailing Apr. 8, 2022; 40 pages.

(Continued)

*Primary Examiner* — Ammar T Hamid
(74) *Attorney, Agent, or Firm* — Dickinson Wright PLLC; Ross Spencer Garsson

(57) ABSTRACT

Voice coil actuators and loudspeakers containing same. The voice coil actuators include moving voice coil assemblies that have multiple segments. Each segment of a moving voice coil assembly is separately controlled by an amplifier, one channel of an amplifier, and combinations thereof utilized in combination with a position sensor that senses the position of the moving voice coil assembly. By this arrangement, the voice coil actuators produce a linear force per unit current throughout the range of motion while obtaining the benefits and advantages associated with both over-hung and under-hung voice coil actuator designs.

28 Claims, 18 Drawing Sheets

(51) Int. Cl.
H04R 1/02 (2006.01)
H04R 7/04 (2006.01)
H04R 9/02 (2006.01)
H04R 9/04 (2006.01)
H04R 9/06 (2006.01)

(52) U.S. Cl.
CPC ............... H04R 9/025 (2013.01); H04R 9/06 (2013.01); H04R 29/003 (2013.01); *H03F 2200/03* (2013.01); *H04R 2201/028* (2013.01); *H04R 2209/041* (2013.01)

(58) Field of Classification Search
CPC ........ H04R 2201/028; H04R 2209/041; H03F 3/183; H03F 2200/03
USPC ...................................... 381/59, 58
See application file for complete search history.

(56) References Cited

FOREIGN PATENT DOCUMENTS

| WO | WO-2019064690 A1 * | 4/2019 | ............... H04R 3/04 |
| WO | 2020086852 A9 | 4/2020 | |
| WO | 2021150278 A1 | 7/2021 | |

OTHER PUBLICATIONS

Patent Cooperation Treaty, International Preliminary Report on Patentability for PCT/US2021/035883, date of mailing Dec. 15, 2022; 18 pages.

* cited by examiner

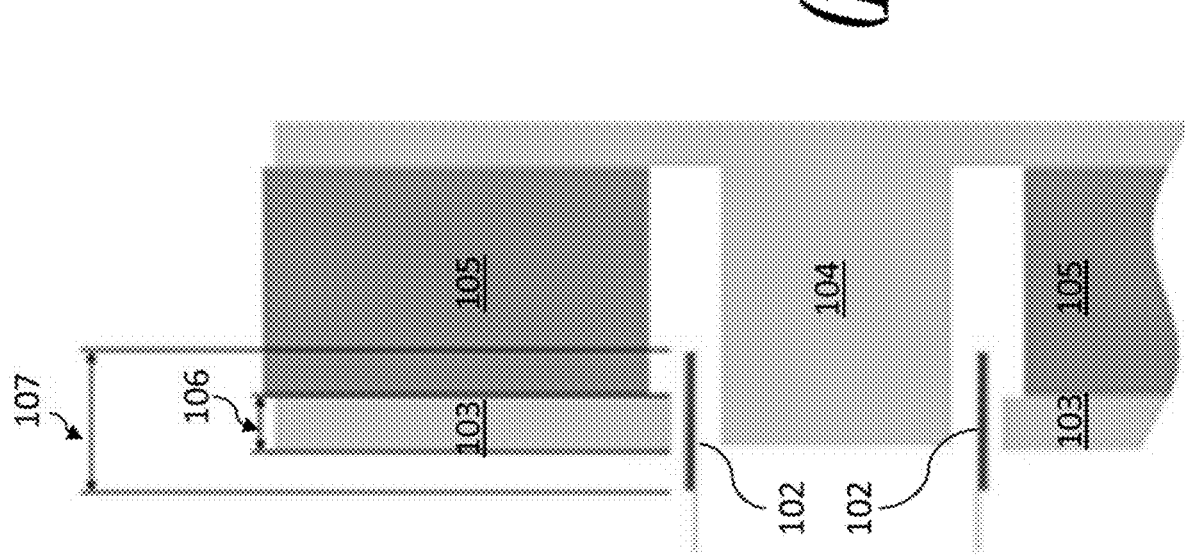

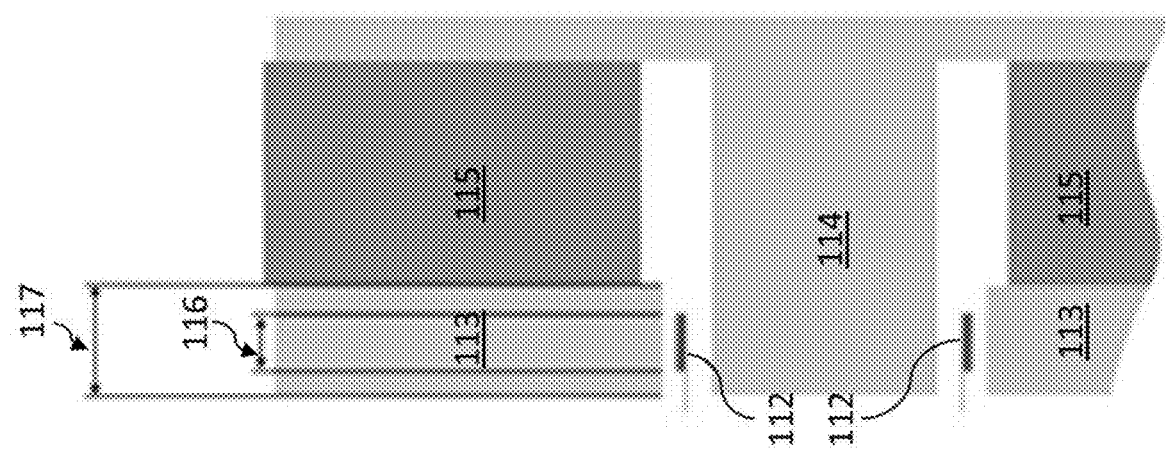

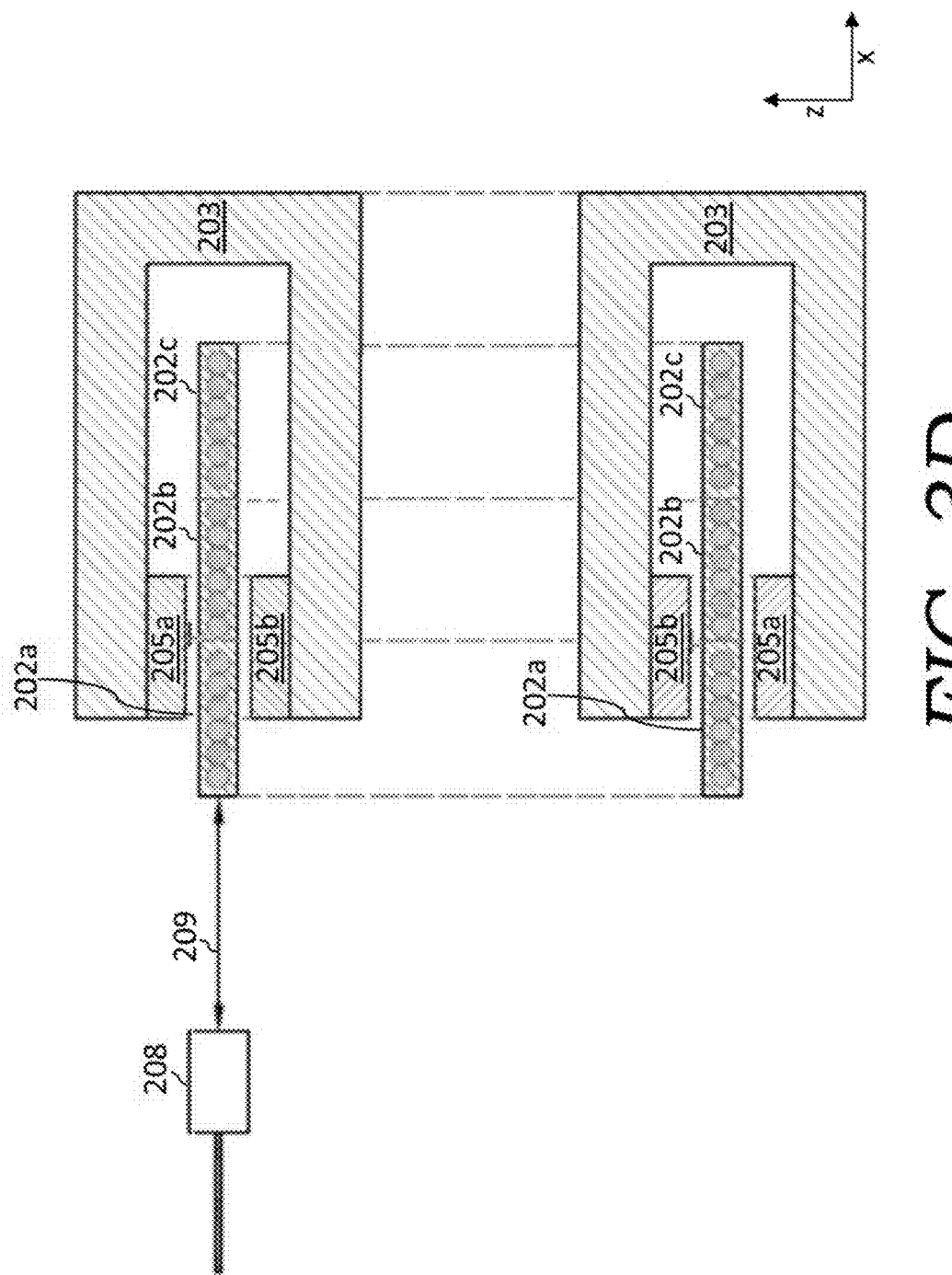

VOICE COIL ACTUATOR AND LOUDSPEAKERS CONTAINING SAME

RELATED PATENTS/PATENT APPLICATIONS

This application is a 35 U.S.C. § 371 national application of PCT Application No. PCT/US21/35883, filed on Jun. 4, 2021, entitled "Voice Coil Actuator And Loudspeakers Containing Same", which claims priority to U.S. Provisional Patent Application No. 63/034,556, filed Jun. 4, 2020, and entitled "Voice Coil Actuator And Loudspeakers Containing Same." These applications are commonly owned by the owner of the present invention and are hereby incorporated by reference in their entirety for all purposes.

This application is also related to U.S. Pat. No. 9,826,313, issued Nov. 21, 2017, to Joseph F. Pinkerton et al., and entitled "Compact Electroacoustic Transducer And Loudspeaker System And Method Of Use Thereof," (the "Pinkerton '313 Patent,") which issued from U.S. patent application Ser. No. 14/717,715, filed May 20, 2015.

This application is also related to International Patent Application No. PCT/US19/057871, filed Oct. 24, 2019, to David A Badger et al., entitled "Stereophonic Loudspeaker System And Method Of Use Thereof," (the "Badger PCT '871 Patent Application"), which claims priority to U.S. Provisional Patent Application Ser. No. 62/749,938, filed on Oct. 24, 2018, 2018, to David A. Badger et al., and entitled "Stereophonic Loudspeaker System And Method Of Use Thereof."

This application is also related to International Patent Application No. PCT/US20/051633, filed Sep. 18, 2020, to Joseph F. Pinkerton et al., entitled "Electroacoustic Drivers And Loudspeakers Containing Same" (the "Pinkerton PCT '633 Patent Application"), which claims priority to (1) U.S. Provisional Patent Application Ser. No. 62/963,833, filed Jan. 21, 2020, to Joseph F. Pinkerton, entitled "Electroacoustic Drivers And Loudspeakers Containing Same," (2) U.S. Provisional Patent Application Ser. No. 63/022,125, filed May 8, 2020, to Joseph F. Pinkerton, entitled "Electroacoustic Drivers And Loudspeakers Containing Same, and (3) U.S. Provisional Patent Application Ser. No. 63/048,393, filed Jul. 6, 2020, to Joseph F. Pinkerton, entitled "Electroacoustic Drivers And Loudspeakers Containing Same.

All of the above-identified patent applications are commonly assigned to the Assignee of the present invention and are hereby incorporated herein by reference in their entirety for all purposes.

TECHNICAL FIELD

The present invention relates to acoustic design technology, and in particular, to voice coil actuator and loudspeakers containing same.

BACKGROUND

Today's conventional loudspeakers utilize a vibration system that includes a voice coil. Generally, a voice coil is a coil of wire attached to the apex of a loudspeaker cone. It provides the motive force to the cone by the reaction of a magnetic field to the current passing through it. By driving a current through the voice coil, a magnetic field is produced. This magnetic field causes the voice coil to react to the magnetic field from a permanent magnet fixed to the speaker's frame, thereby moving the cone of the speaker. By applying an audio waveform to the voice coil, the cone will reproduce the sound pressure waves, corresponding to the original input signal.

Because the moving parts of conventional loudspeakers are generally of low mass (to accurately reproduce high-frequency sounds without being damped too much by inertia), voice coils are usually made as lightweight as possible, making them delicate. Passing too much power through the coil can cause it to overheat. Voice coils wound with flattened wire, called ribbon-wire, provide a higher packing density in the magnetic gap than coils with round wire.

Some voice coils are made with surface-sealed bobbin and collar materials so they may be immersed in a ferrofluid that assists in cooling the coil, by conducting heat away from the coil and into the magnet structure. Excessive input power at low frequencies can cause the coil to move beyond its normal limits, causing distortion and possibly mechanical damage.

Many hi-fi, and almost all professional low frequency loudspeakers (woofers) include vents in the magnet system to provide forced-air cooling of the voice coil. The pumping action of the cone and the dust cap draws in cool air and expels hot air. This method of cooling relies upon cone motion, so is ineffective at midrange or treble frequencies, although venting of midranges and tweeters does provide some acoustic advantages.

In the earliest loudspeakers, voice coils were wound onto paper bobbins, which was appropriate for modest power levels. As more powerful amplifiers became available, alloy 1145 aluminum foil was widely substituted for paper bobbins, and the voice coils survived increased power. Typical modern hi-fi loudspeaker voice coils employ materials that can withstand operating temperatures up to 150° C., or even 180° C. For professional loudspeakers, advanced thermoset composite materials are available to improve voice coil survival under severe simultaneous thermal (<300° C.) and mechanical stresses.

Aluminum was widely used in the speaker industry due to its low cost, ease of bonding, and structural strength. When higher power amplifiers emerged, especially in professional sound, the limitations of aluminum were exposed. It rather efficiently but inconveniently transfers heat from the voice coil into the adhesive bonds of the loudspeaker, thermally degrading or even burning them. Motion of the aluminum bobbin in the magnetic gap created eddy currents within the material, which further increase the temperature, hindering long-term survival. In 1955 DuPont developed Kapton, a polyimide plastic film that did not suffer from aluminum's deficiencies, so Kapton, and later Kaneka Apical have been widely adopted for voice coils. As successful as these dark brown plastic films were for most hi-fi voice coils, they also had some less attractive properties, principally their cost, and an unfortunate tendency to soften when hot. Hisco P450, developed in 1992 to address the softening issue in professional speakers, is a thermoset composite of thin glass-fiber cloth, impregnated with polyimide resin, combining the best characteristics of polyimide with the temperature resistance and stiffness of glass-fiber. It can withstand brutal physical stresses and operating temperatures up to 300° C., while its stiffness helps maintain the speaker's 'cold' frequency response.

In traditional loudspeakers, the actual wire employed in voice coil winding is typically copper, with an electrical insulation coating, and in some cases, an adhesive overcoat. Copper wire provides an easily manufactured, general-purpose voice coil, at a reasonable cost. Where maximum sensitivity or extended high frequency response is required from a loudspeaker, aluminum wire may be substituted, to reduce the moving mass of the coil. While rather delicate in a manufacturing environment, aluminum wire has about one third of the mass of the equivalent gauge of copper wire, and has about two-thirds of the electrical conductivity. Copper-clad aluminum wire can alternatively be used, allowing easier winding, along with a useful reduction in coil mass compared to copper.

Anodized aluminum flat wire can be used, providing an insulating oxide layer more resistant to dielectric breakdown than enamel coatings on other voice coil wire. This creates lightweight, low-inductance voice coils, ideally suited to use in small, extended range speakers. The principal power limitation on such coils is the thermal softening point of the adhesives that bond the wire to the bobbin, or the bobbin to the spider and coil.

Voice coils can be used for applications other than loudspeakers, where time force linearity and long strokes are needed. Some environments like vacuum or space require specific attention during conception, in order to evacuate coil losses. Several specific methods can be used to facilitate thermal drain.

Power handling is related to the heat resistance of the wire insulation, adhesive, and bobbin material, and may be influenced by the coil's position within the magnetic gap. The majority of loudspeakers use "over-hung" voice coils, such as shown in FIG. 1A, with voice coil 102, iron (other metal) materials 103 and 104, and permanent magnetic material 105, in which the coil height 107 is taller than the height of the magnetic gap 106. In this topology, a portion of the coil 102 remains within the gap 106 at all times. The power handling is typically limited by the amount of heat that can be tolerated, and the amount that can be removed from the voice coil 102. Some magnet designs include aluminum heat-sink rings above and below (in the z-axis direction) the coil 102, to improve conduction cooling, significantly improving power handling. If all other conditions remain constant, the area of the voice coil 102 is proportional to the power handling of the coil. Thus a 100 mm diameter voice coil, with a 12 mm winding height, can have similar power handling to a 50 mm diameter voice coil with a 24 mm winding height.

In loudspeakers having "under-hung" voice coils, such as shown in FIG. 1B, with voice coil 112, iron (other metal) materials 113 and 114, and permanent magnetic material 115, the coil height 116 is shorter than the magnetic gap 117. Such topology provides consistent electromotive force over a limited range of motion, known as $X_{max}$. If the coil is overdriven it may leave the gap, generating significant distortion and losing the heat-sinking benefit of the steel, heating rapidly.

The differences, advantages, and disadvantages of over-hung and under-hung coils include:

For over-hung coils:
Coil height is greater than the gap's height;
This design keeps the number of windings within the magnetic field (or flux) constant over the coil's normal excursion range;
Higher coil mass, sensitivity low to medium; and
Soft non-linearity as the coil exceeds limits.
For under-hung coils:
Gap's height is greater than the coil's height;
Large and heavy back iron required;
This method keeps the magnetic flux that the coil experiences, constant over the coil's normal excursion range;
Low coil mass, sensitivity medium to high; and
Hard non-linearity as the coil exceeds limits.

Both over-hung and under-hung designs attempt the same goal, namely, linear force acting on the coil, for a driver that reproduces the applied signal faithfully. Thus, both over-hung and under-hung designs produce a linear force per unit current throughout the range of motion. The entire coil of an under-hung design is in the magnetic field throughout the range of motion and is thus efficient. An over-hung voice coil is much less efficient because it takes three times the power to produce the same force as an under-hung design (two-thirds of the over-hung coil 102 is not in the magnetic field). A significant downside of under-hung design is that roughly three times the back iron 113-114 is needed (resulting in a heavy, expensive design) to carry the much higher magnetic flux, which is shown by the larger gap 117, as compared with gap 107 for the over-hung design.

Accordingly, there is a need in the art for an improved voice coil, including for use in conventional loudspeakers as well as other loudspeaker devices, such as the devices disclosed and described in the Pinkerton '313 Patent, the Badger PCT '871 Patent Application, and the Pinkerton PCT '633 Patent Application.

DESCRIPTION OF DRAWINGS

FIG. 1A is an illustration of a cross-section view of an over-hung voice coil actuator utilized in a loudspeaker.

FIG. 1B is an illustration of a cross-section view of an under-hung voice coil actuator utilized in a loudspeaker.

FIGS. 3A-3E are illustrations of the voice coil actuator shown in FIG. 2, showing the moving voice coil assembly at different positions along the x-axis direction.

SUMMARY OF THE INVENTION

Figure 2:
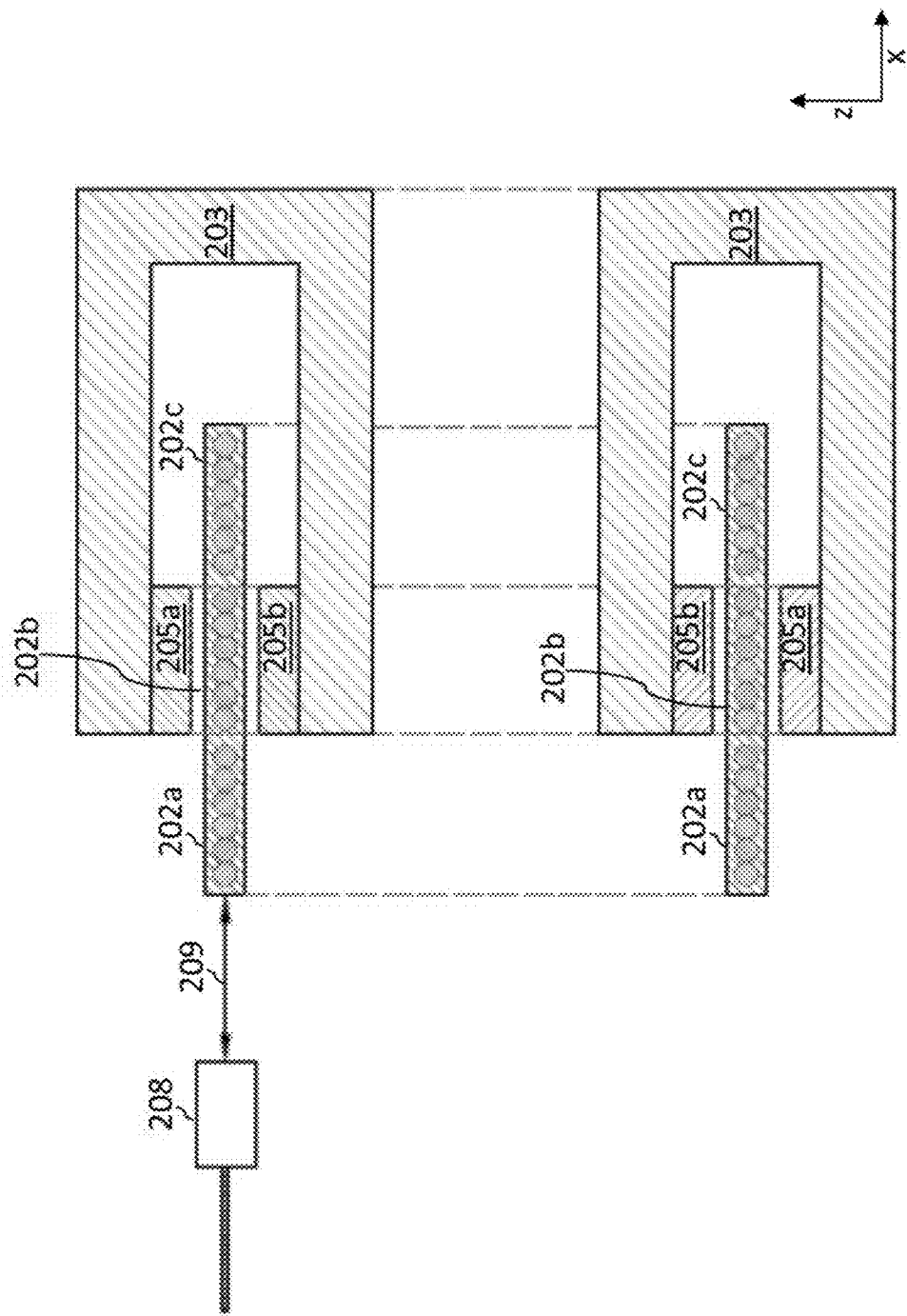
FIG. 2 is an illustration of a voice coil actuator of the present invention that can be utilized in a loudspeaker.

The present invention is directed voice coil actuators and loudspeakers containing same. The voice coil actuators include moving voice coil assemblies that have multiple segments. Each segment of a moving voice coil assembly is separately controlled by an amplifier, one channel of an amplifier, and combinations thereof utilized in combination with a position sensor that senses the position of the moving voice coil assembly. By this arrangement, the voice coil actuators produce a linear force per unit current throughout the range of motion while obtaining the benefits and advantages associated with both over-hung and under-hung voice coil actuator designs.

In general, in one aspect, the invention features a loudspeaker that includes a sealed enclosure. The loudspeaker further includes a sound panel mechanically connected to the sealed enclosure. The loudspeaker further includes a voice coil actuator operable to convert electrical energy into mechanical energy for movement of the sound panel. The voice coil actuator includes a plurality of voice coil segments. The loudspeaker further includes one or more amplifiers. Each voice coil segment in the plurality of voice coil segments is operatively connected to an amplifier in the plurality of amplifier for applying segment current to the voice coil segment. The loudspeaker further includes a position sensor that senses the position of one or more of the sound panel and the voice coil actuator. The segment current applied to each voice coil segment is independently controlled by the amplifier operatively connected thereto based upon the position sensed by the position sensor.

Implementations of the invention can include one or more of the following features:

The loudspeaker can further include one or more stationary magnets that define one or more stationary magnet gaps. The plurality of voice coil segments can include i number of voice coil segments. The voice coil actuator can be operable to move the voice coil segments to change fractional portions of the voice coil segments within the one or more stationary magnet gaps. The fractional portions for the i number of voice coil segments within the one or more stationary magnet gaps can be voice coil segment fractions $x_1$ though $x_i$, respectively. Each of voice coil segment fractions $x_1$ though $x_i$ can be between 0 to 1, inclusive. The segment currents applied to the voice coil segments can be operatively controlled by one or more amplifiers based upon the voice coil segment fractions $x_1$ though $x_i$ at the position sensed by the position sensor.

The segment currents applied to each of the voice coil segments 1 through i, can be, respectively, $i_j$ with $i_j=\{Kx_j/[\Sigma_{k=1}^{i}(x_k)^2]\}\pm 10\%$. K can be based upon a magnetic force to be created by the voice coil segments, and j can be an integer from 1 to i.

The segment currents applied to each of the voice coil segments 1 through i, can be, respectively, $i_j$ with $i_j=\{Kx_j/[\Sigma_{k=1}^{i}(x_k)^2]\}\pm 5\%$.

The segment currents applied to each of the voice coil segments 1 through i, can be, respectively, $i_j$ with $i_j=\{Kx_j/[\Sigma_{k=1}^{i}(x_k)^2]\}$.

K can be based upon the magnetic force to be created for application at the position sensed by the position sensor.

K can be a constant.

The i number of voice coil segments can be between 2 and 6.

The i number of voice coil segments can be between 3 and 4.

In at least some positions sensed by the position sensor, at least some, but not all, of the voice coil segments can have voice coil segments fractions $x_1$ though $x_i$ that are 0.

The one or more stationary magnets can be one or more permanent magnets.

The position sensor can be selected from a group consisting of infrared position sensors, capacitive position sensors, inductive position sensor, and combinations thereof.

The one or more amplifiers can include at least one amplifier having two channels that can independently control the application of current in two different voice coil segments in the plurality of voice coil segments.

The one or more amplifiers can be one amplifier having two channels.

The one or more amplifiers can include at least two amplifiers with each having two channels.

In general, in another aspect, the invention features a method of using a loudspeaker. The method includes selecting a loudspeaker that includes a sealed enclosure. The loudspeaker further includes a sound panel mechanically connected to the sealed enclosure. The loudspeaker further includes a voice coil actuator. The voice coil includes a plurality of voice coil segments. The loudspeaker further includes one or more amplifiers. The loudspeaker further includes a position sensor. The method further includes utilizing the voice coil actuator to move the sound panel. The method further includes utilizing the position sensor to sense the position of one or more of the sound panel and the voice coil actuator. The method further includes utilizing the one or more amplifiers to independently apply a plurality of segment currents. Each segment current in the plurality of segment currents is applied to a respective voice coil segment in the plurality of voice coil segments. Amounts of each segment current in the plurality of segment currents are varied based upon the position sensed by the position sensor.

Implementations of the invention can include one or more of the following features:

The loudspeaker can further include one or more stationary magnets that define one or more stationary magnet gaps. The plurality of voice coil segments can include i number of voice coil segments. Movement of the voice coil actuator can move the voice coil segments to change fractional portions of the voice coil segments within the one or more stationary magnet gaps. The fractional portions for the i number of voice coil segments within the one or more stationary magnet gaps can be voice coil segment fractions $x_1$ though $x_i$, respectively. Each of voice coil segments fractions $x_1$ though $x_i$ can be between 0 to 1, inclusive. The amounts of each segment current applied by the one or more amplifiers can be varied based upon the voice coil segments fractions $x_1$ though $x_i$ at the position sensed by the position sensor.

The segment currents applied to each of the voice coil segments 1 through i, can be, respectively, $i_j$ with $i_j=\{Kx_j/[\Sigma_{k=1}^{i}(x_k)^2]\}\pm 10\%$. K can be based upon a magnetic force to be created by the voice coil segments, and j can be an integer from 1 to i.

The segment currents applied to each of the voice coil segments 1 through i, can be, respectively, $i_j$ with $i_j=\{Kx_j/[\Sigma_{k=1}^{i}(x_k)^2]\}\pm 5\%$.

The segment currents applied to each of the voice coil segments 1 through i, can be, respectively, $i_j$ with $i_j=\{Kx_j/[\Sigma_{k=1}^{i}(x_k)^2]\}$.

K can be based upon the magnetic force created for application at the position sensed by the position sensor.

K can be a constant.

The i number of voice coil segments can be between 2 and 6.

The i number of voice coil segments can be between 3 and 4.

In at least some positions sensed by the position sensor, at least some, but not all, of the voice coil segments can have voice coil segments fractions $x_1$ though $x_i$ that are 0

The one or more stationary magnets can be one or more permanent magnets.

The position sensor can be selected from a group consisting of infrared position sensors, capacitive position sensors, inductive position sensor, and combinations thereof.

The one or more amplifiers can include at least one amplifier having two channels. The utilizing of the one or more amplifiers can include using the amplifier having two channels to independently apply current in two different voice coil segments in the plurality of voice coil segments.

The one or more amplifiers can be one amplifier having two channels.

The one or more amplifiers can include at least two amplifiers with each having two channels.

DETAILED DESCRIPTION

The present invention relates to acoustic design technology, and in particular, to voice coils and loudspeakers containing same. The present invention obtains the advantages and benefits of the under-hung and over-hung voice coil designs and achieves the best of both worlds. This includes small/light/cheap back iron (or other metal materials) plus high efficiency. This can be accomplished by breaking up the voice coil of an over-hung design into two (or more) sections.

FIG. 2 shows a voice coil actuator in which the voice coil has three voice coil sections 202a-202c that are on a moving voice coil assembly (also referred to as an moving voice coil armature) that can move voice coil sections 202a-202c along the x-axis direction in the voice coil actuator. The voice coil actuator further includes permanent magnets 205a-205b and iron (or other metal) material 203. Using a position sensor 208 (which is an inexpensive device and used to measure distance 209) and three amplifiers (which are likewise inexpensive) that are independently operatively connected to voice coil sections 202a-202c, respectively, current is routed to each voice coil sections 202a-202c depending on the moving voice coil assembly position relative to permanent magnets 205a-205b (which are of different polarity, i.e., permanent magnet 205a is positive while permanent magnet 205b is negative, or vice versa). The area between permanent magnets 205a-205b is the gap of the voice coil.

Figure 3A:
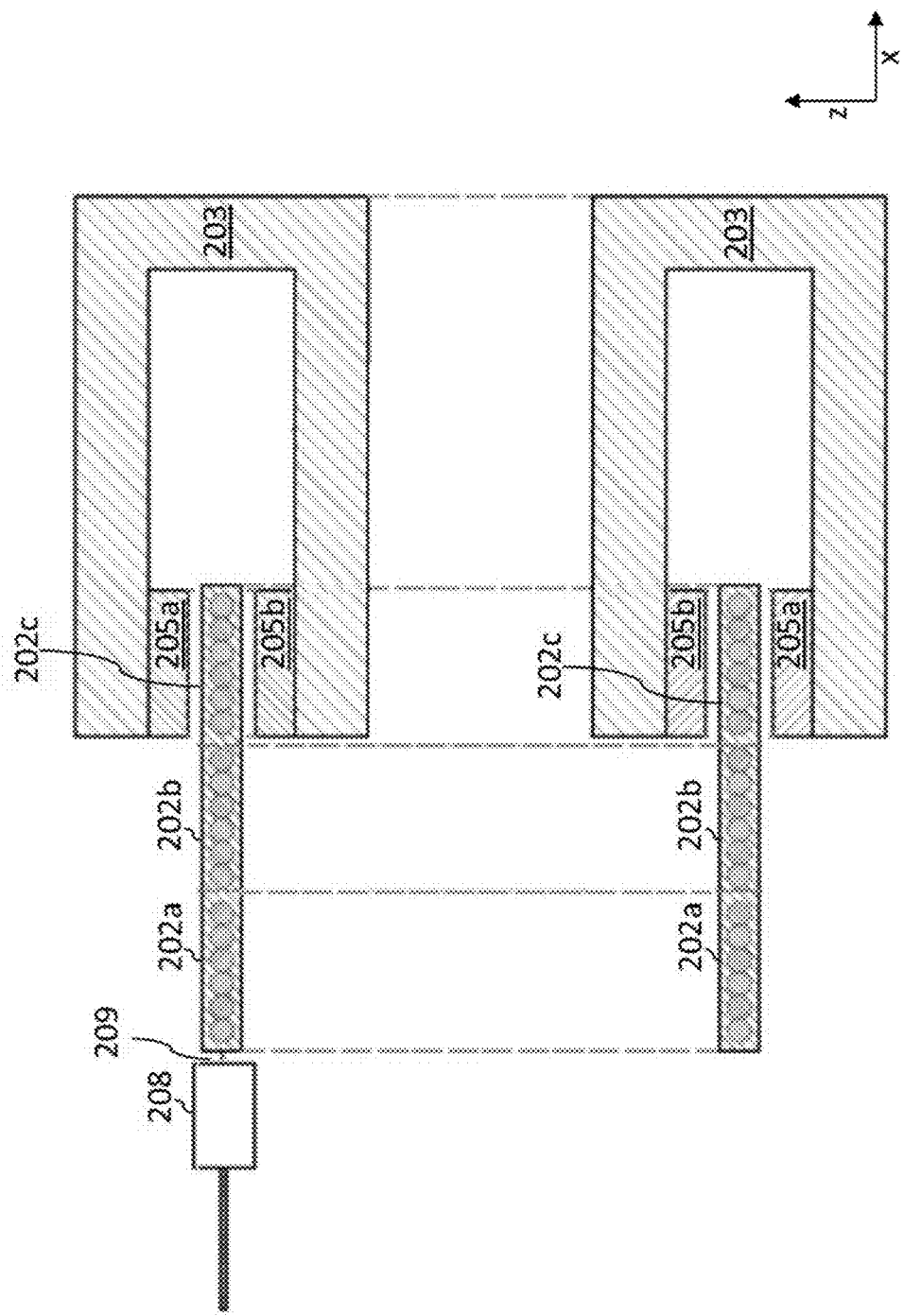
Figure 3B:
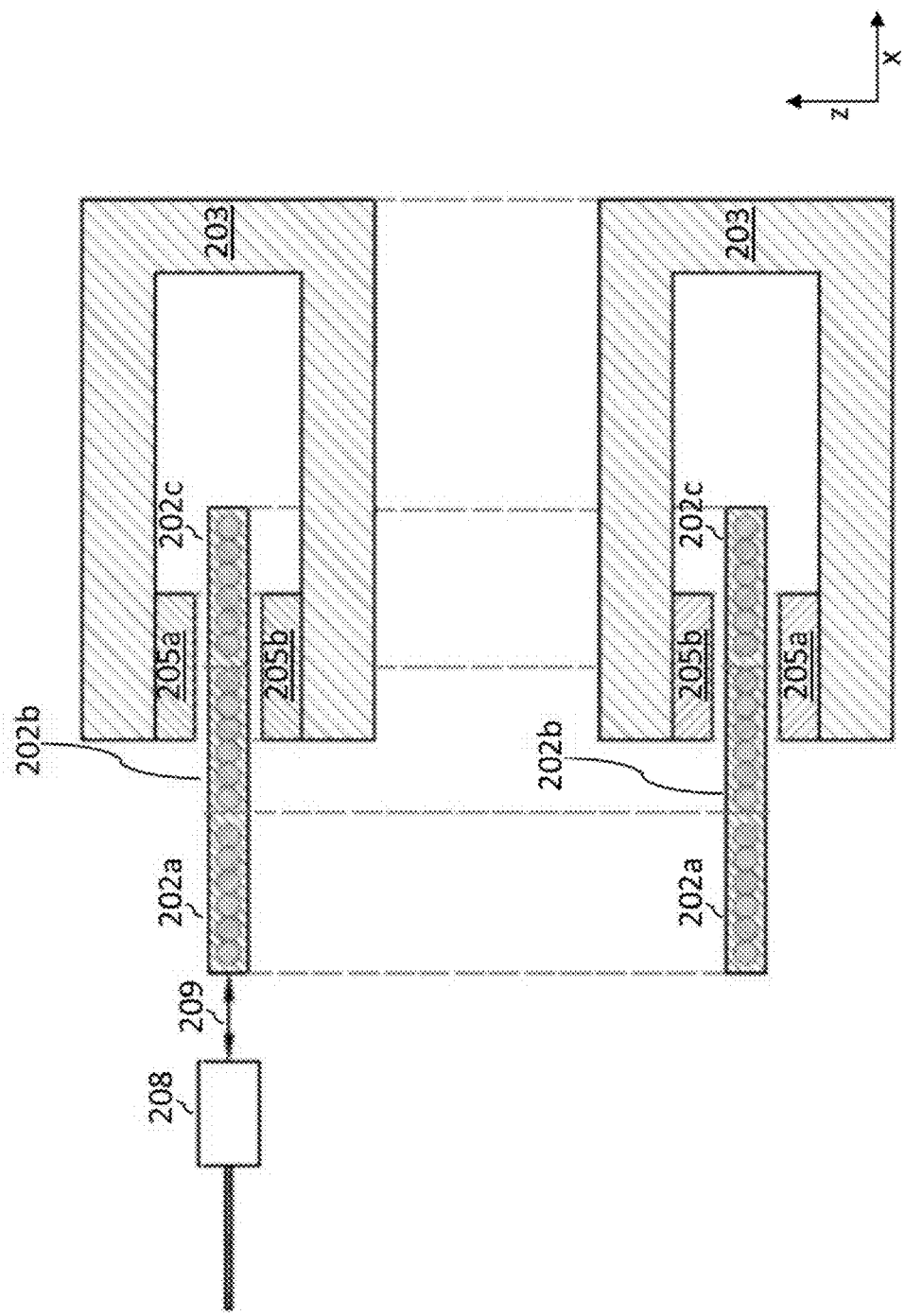
Figure 3C:
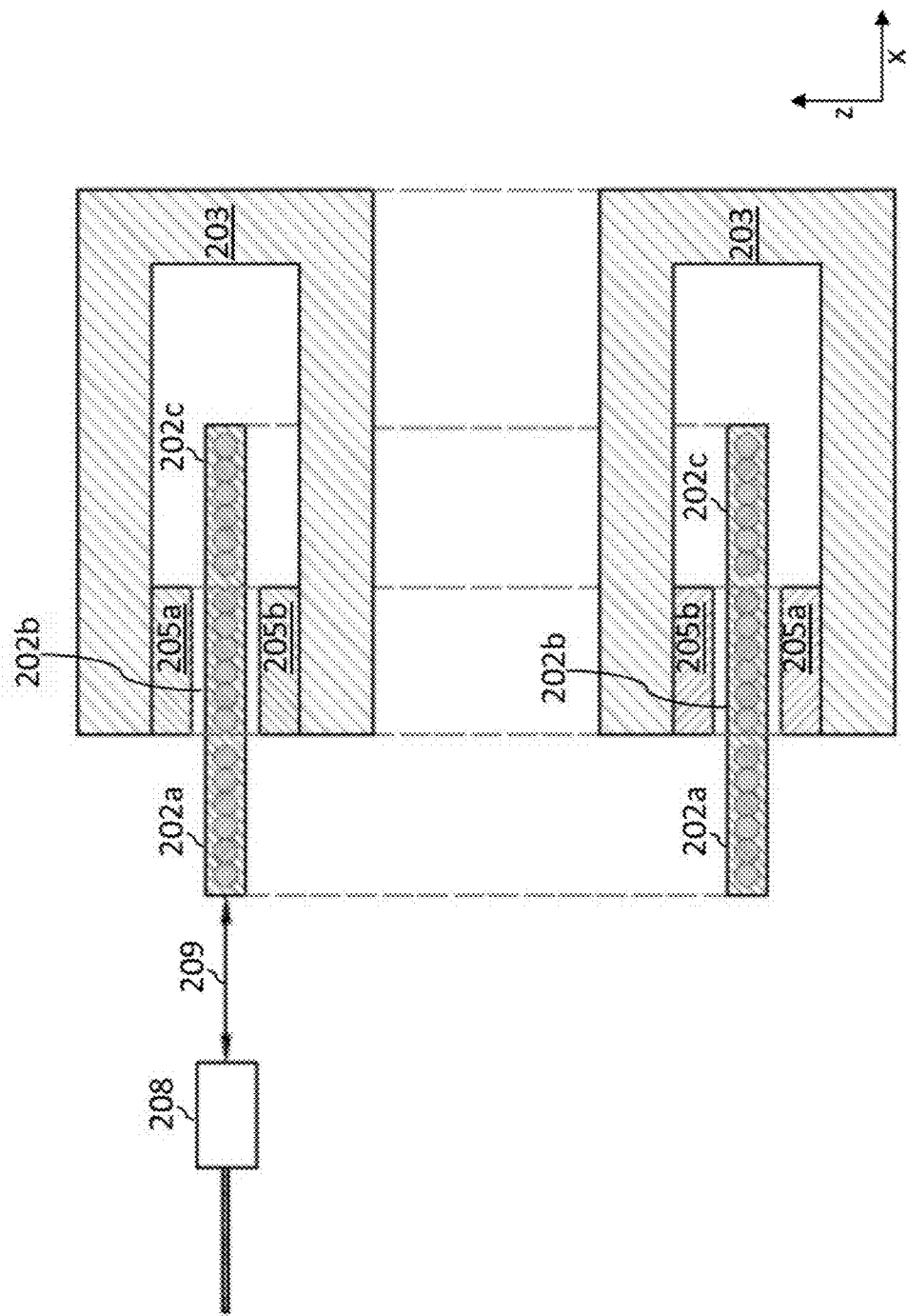

If the moving voice coil assembly is positioned at the "center position" (such as shown in FIG. 2 and FIG. 3C), all the current is routed to voice coil section 202b (burning one-third of the power as compared to a standard over-hung design), as this is the section that is within the magnetic field of the gap.

By way of example, if the segments 202a-202c are voice coils that are each one meter in length (Example A), this is comparable to a combined voice coil having a total length of 3 meters (Comparable Example B). If, in Comparable Example B (these coil segments were to be controlled by one amplifier (one channel)) and the magnetic field density in the air-gaps is 1 T, this would require a current of 1 amp in each segment and would produce 1 Newton of force. If the moving voice coil assembly is positioned at the "center position" (similar to as shown in FIG. 2 and FIG. 3C), only voice coil segment 202b would be immersed in the respective magnetic fields in the gap (between permanent magnets 205a-205b). Thus, only voice coil segment 202b produces force. In Comparative Example B, each voice coil segments 202a-202c will burn 1 W of power so all three will burn 3 W assuming the resistance of each coil is one ohm (when driven with one amplifier having one channel). Indeed, this burn of 3 W in Comparative Example B will occur at any positioning of the voice coil segments 202a-202c (such as shown in FIGS. 3A-3E) because there is always 1 meter of the voice coil segments 202a-202c within the gap (with the other parts of the voice coil segments 202a-202c outside the gap).

Referring to Example A, which is comparable to Comparative Example B, except that, in Example A, each of segments 202a-202c has a current that is independently controlled. In the voice coil actuator of the present invention shown in FIG. 2 (having three channels, with one for each of voice coil segments 202a-202c) only voice coil segment 202b would be carrying 1 amp of current (with voice coil segments 202a and 202c carrying zero amps) and so the total power is 1 W in Example A. This is a reduction by a factor of three (from 3 W (in Comparative Example B) to 1 W (in Example A)) under the same conditions.

Figure 3E:
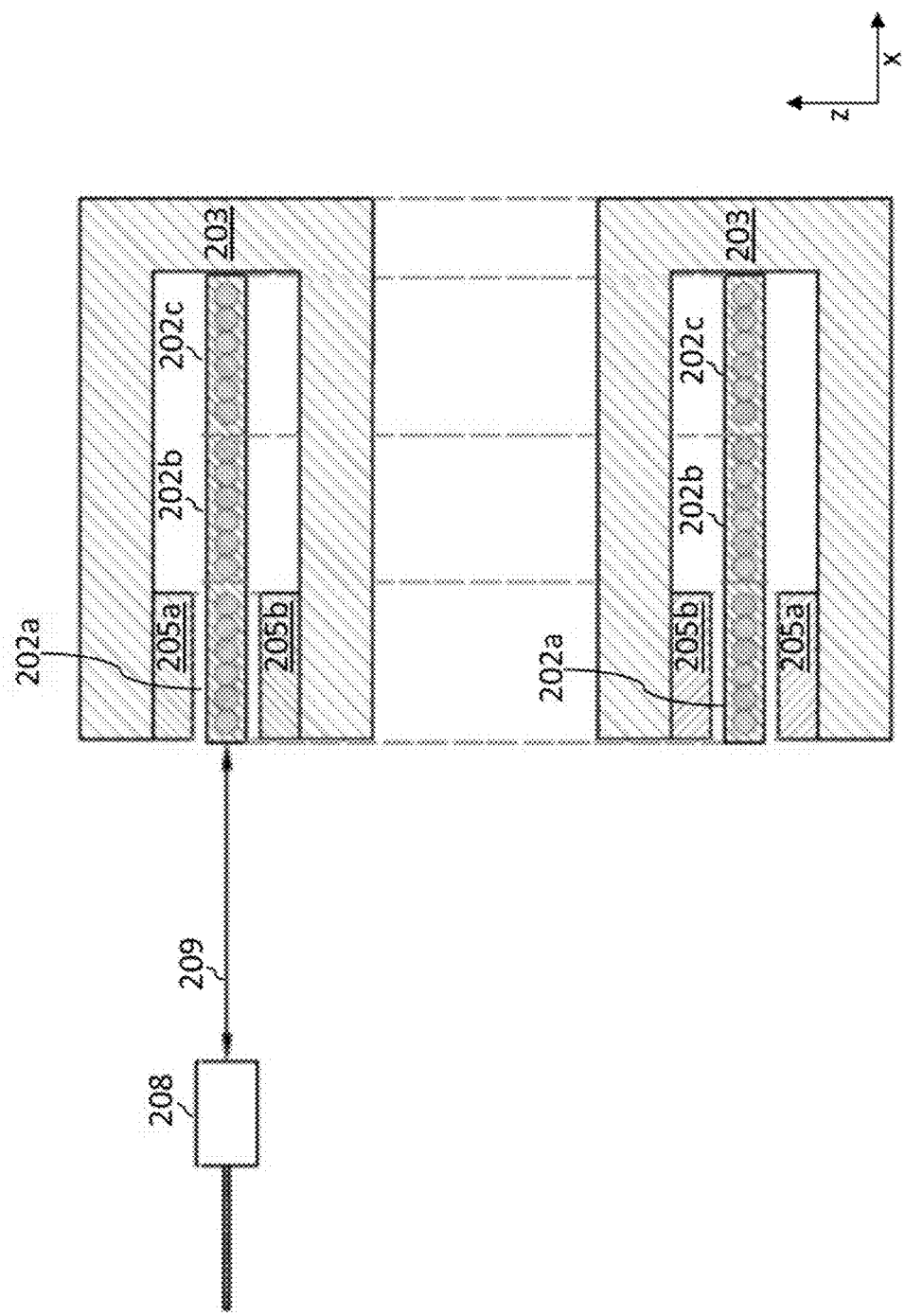

If the moving voice coil assembly is at a position all the way in the positive x-axis direction (the "full positive position"), such as shown in FIG. 3E, the current is routed to voice coil section 202a, again as this is the section that is within the gap. Thus, for the above example, in Example A, the total power is again 1 W. Again, this is a reduction by a factor of three (from 3 W (in Comparative Example B) to 1 W (in Example A)) under the same conditions.

If the moving voice coil assembly is at a position halfway between the center position and the full positive position, such as shown in FIG. 3D, part of the current is routed to voice coil section 202a and the other part of the current is routed to voice coil section 202b. This is because parts of each of sections 202a-202b are within the gap. Generally, in such position shown in FIG. 3D, this division between the current routed to voice coil sections 202a-202b would be at a 50/50 split (i.e., half of the current would be routed to voice coil section 202a and the other half would be routed to voice coil section 202b).

Again, under the above conditions of Example A (and Comparable Example B), the total power for Example A at the position shown in FIG. 3D, would be 2 W, as shown in TABLE I. This is a reduction by a factor of 1.5 (from 3 W (in Comparable Example B) to 2 W (in Example A)) under the same conditions.

TABLE I (Example A at 50/50 split position shown in FIG. 3D)

| | |
|---|---|
| Current in segment 202a | 1 amp |
| Current in segment 202b | 1 amp |
| Current in segment 202c | 0 amp |
| Fraction immersion of segment 202a in gap | 50% |
| Fraction immersion of segment 202b in gap | 50% |
| Fraction immersion of segment 202c in gap | 0% |
| Magnetic Field Density in gap | 1 T |
| Resistance of segment 202a | 1 ohm |
| Resistance of segment 202b | 1 ohm |
| Resistance of segment 202c | 1 ohm |
| Power of segment 202a | 1 W |
| Power of segment 202b | 1 W |
| Power of segment 202c | 0 W |
| Total power (of segments 202a-202c) | 2 W |
| Power Ratio with Comparative Example B (3 W) | 1.5 |

Under the above conditions of Example A (and Comparable Example B), the total power for Example 1 at such 25/75 split position, would be 1.6 W, as shown in TABLE II. This is a reduction by a factor of 1.875 (from 3 W (in Comparable Example B) to 1.6 W (in Example A)) under the same conditions.

TABLE II (Example A at 25/75 split position)

| | |
|---|---|
| Current in segment 202a | 0.4 amp |
| Current in segment 202b | 1.2 amp |
| Current in segment 202c | 0 amp |
| Fraction immersion of segment 202a in gap | 25% |
| Fraction immersion of segment 202b in gap | 75% |

TABLE II-continued (Example A at 25/75 split position)

| | |
|---|---|
| Fraction immersion of segment 202c in gap | 0% |
| Magnetic Field Density in gap | 1 T |
| Resistance of segment 202a | 1 ohm |
| Resistance of segment 202b | 1 ohm |
| Resistance of segment 202c | 1 ohm |
| Power of segment 202a | 0.16 W |
| Power of segment 202b | 1.44 W |
| Power of segment 202c | 0 W |
| Total power (of segments 202a-202c) | 1.6 W |
| Power Ratio with Comparative Example B (3 W) | 1.875 |

Note that as shown in TABLE II, that the ratio of the currents between voice coil segment 202a to voice coil segment 202b are 0.4 amp to 1.2 amp are at a ratio of 0.25% to 0.75%. If the current is increased in voice coil segment 202b (such as to 1.3 amp) this would require a reduction in the current in voice coil segment (such as to 0.1 amp) to maintain a force level of 1 N. However, this would raise the total power to 1.7 W.

Furthermore, under the above conditions of Example A (and Comparable Example B), the total power for Example A at such 20/80 split position, would be 1.47 W, as shown in TABLE III This is a reduction by a factor of 2.04 (from 3 W (in Comparable Example B) to 1.47 W (in Example A)) under the same conditions.

TABLE III (Example A at 20/80 split position)

| | |
|---|---|
| Current in segment 202a | 0.295 amp |
| Current in segment 202b | 1.176 amp |
| Current in segment 202c | 0 amp |
| Fraction immersion of segment 202a in gap | 20% |
| Fraction immersion of segment 202b in gap | 80% |
| Fraction immersion of segment 202c in gap | 0% |
| Magnetic Field Density in gap | 1 T |
| Resistance of segment 202a | 1 ohm |
| Resistance of segment 202b | 1 ohm |
| Resistance of segment 202c | 1 ohm |
| Power of segment 202a | 0.086 W |
| Power of segment 202b | 1.384 W |
| Power of segment 202c | 0 W |
| Total power (of segments 202a-202c) | 1.47 W |
| Power Ratio with Comparative Example B (3 W) | 2.04 |

Note that as shown in TABLE III, the ratio of the currents between voice coil segment 202a to voice coil segment 202b are 0.295 amp to 1.176 amp are at a ratio of 0.20% to 0.80%. If, at this 20/80 split, the current in voice coil segment 202b is set by its amplifier above 1.176 amp, this would require the current in voice coil segment 202a to be set by its amplifier to below 0.04 amp to maintain a force of 1 N, which would have the effect of increasing the total power.

In some embodiments, there can be a cross over point near the edges (i.e., where one segment is almost completely within the gap, while the other segments are outside the gap, where the voice coil segment nearly fully immersed in the magnetic field is the only section that has a current (and the others have no current). Thus, while generally it can be optimal in certain embodiments to have the percent current in each section to be prorate portions of the sections in the gap, when one voice coil segment is nearly completely within the gap (with one other voice coil segment completely outside the gap and the third voice coil segment almost completely outside the gap), embodiments of the invention can have the amplifiers provide for current only in the one voice coil segment nearly completely within the gap (and zero current in the other two voice coil segments).

In further alternative embodiments, the amount of current and the division of the current between the sections can be adjusted, if desired.

In further alternative embodiments, the resistance of the voice coil segments can be different from one another, which will have an impact on the current carried and the power generated by each voice coil segment.

Similarly, if the moving voice coil assembly is at a position all the way in the negative x-axis direction (the "full negative position"), such as shown in FIG. 3A, the current is routed to voice coil section 202c, again as this is the section that is within the gap.

If the moving assembly is a position halfway between the center position and the full positive, such as shown in FIG. 3B, part of the current is routed to voice coil section 202b and the other part of the current is routed to voice coil section 202c. This is because parts of each of sections 202b-202c are within the gap. Generally, in such position shown in FIG. 3B, this division between the current routed to voice coil sections 202b-202c would be at a 50/50 split (i.e., half of the current would be routed to voice coil section 202b and the other half would be routed to voice coil section 202c). Moreover, the division of the current routed to voice coil sections 202b-202c can be at the same proportions as proportions of these sections within the gap. Again, for example, if the moving voice coil assembly is positioned so that it has only move 25% from the center position to the full negative position (i.e., 75% of voice coil section 202b and 25% of voice coil section 202c are within the gap, 75% of the current would be routed to section 202b and 25% of the current would be routed to section 202c. Again, in alternative embodiments, the amplifier can be adjusted to other parameters. The total power ratios would be similar to as discussed above in Example A.

And, again, in alternative embodiments, the amount of current and the division of the current between the sections can be adjusted, if desired, such as to better produce a linear force per unit current throughout the range of motion.

On average, the three segment voice coil design shown in FIG. 2 will consume around two to three times less power as a conventional over-hung voice coil design yet be able to use the small/light/cheap magnetic circuit of an over-hung voice coil design. If the voice coil system consumes around two to three times less power, this means a battery that is around two to three times smaller would be required for a mobile speaker or other device utilizing the voice coil actuator, which would result in lowering the battery size, weight, and cost. Battery savings would offset the cost for the two extra amplifiers, the position sensor 208, and the associated position sensor circuitry. Alternatively, if the same battery size were used as in a conventional design, battery run time would be significantly extended.

Figure 4A:
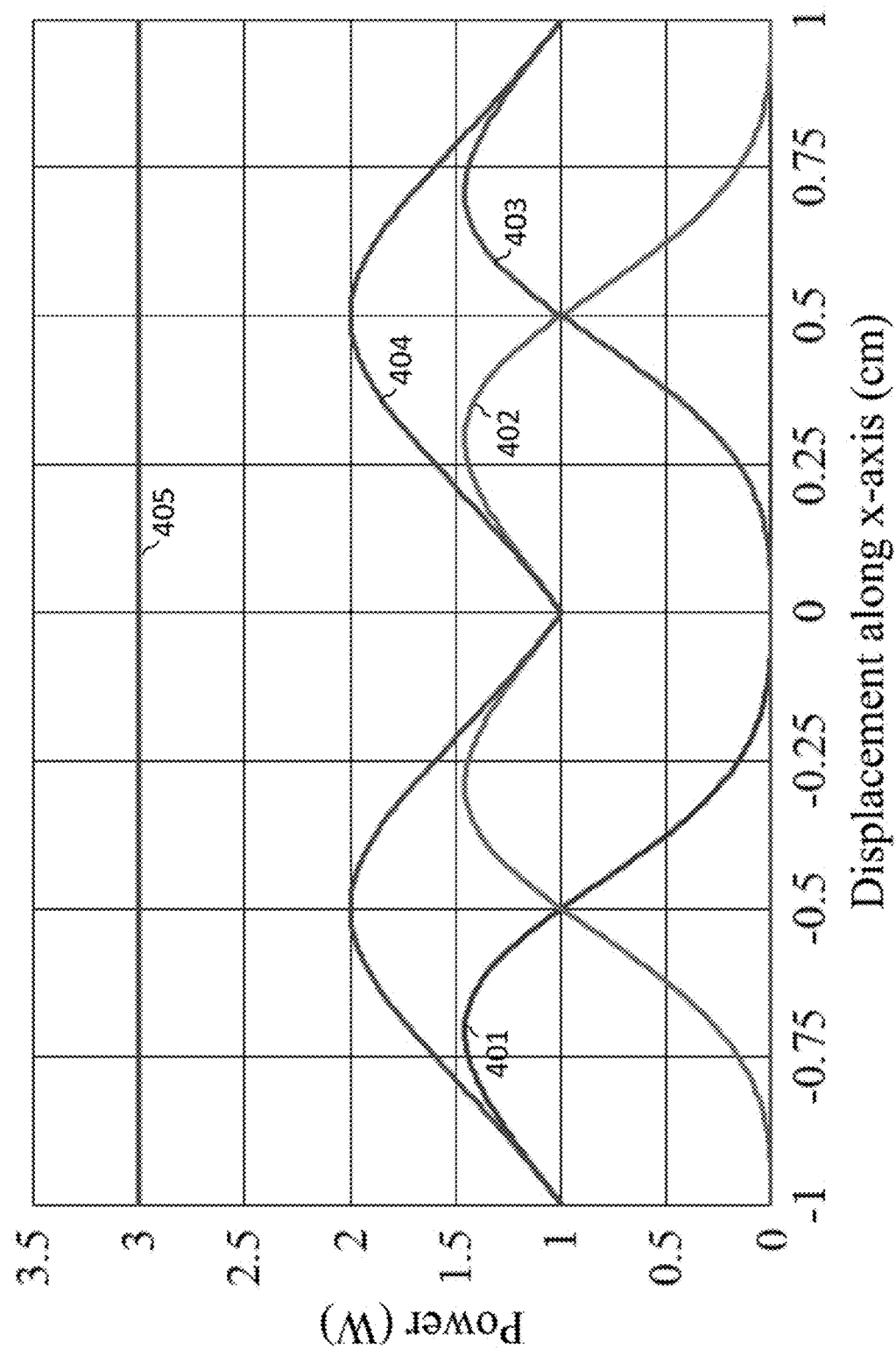
FIG. 4A is a graph showing power curves versus displacement along then x-direction for the voice coil actuator shown in FIG. 2.

FIG. 4A shows power curves versus displacement along then x-direction for the voice coil actuator shown in FIG. 2. The conditions are the same as those described above for Example A and Comparative Example B. Curves 401-403 show the power curves for segments 202a-202c, respectively. Curve 404 is the total power (i.e., the sum of power curves 401-403). Curve 405 is the total power for the voice actuator shown in FIG. 2, except that all sections have the same current applied (which is consistent with Comparative Example B). In the embodiment of FIG. 2 (with currents independently applied to sections 202a-202c), the current applied to segments 202a-202c ($i_a$, $i_b$, and $i_c$, respectively)

were as follows (with the amount of immersion of sections 202a-202c being designated as $x_a$, $x_b$, and $x_c$, respectively) to minimize power:

$$i_a = x_a/((x_a)^2 + (x_b)^2 + (x_c)^2)$$

$$i_b = x_b/((x_a)^2 + (x_b)^2 + (x_c)^2)$$

$$i_c = x_c/((x_a)^2 + (x_b)^2 + (x_c)^2)$$

These equations can be simplified in the various positions as follows:

(a) For the full negative position (such as shown in FIG. 3A) (with $x_a=0$, $x_b=0$, and $x_c=1$), is was 1 amp, and $i_a$ and $i_b$ were each 0 amp;

(b) For a negative displacement having a split between a portion of segment 202c in the gap ($x_c$) and a portion of segment 202b in the gap ($x_b$) (with $x_a=0$ and $x_c=1-x_b$)

$$i_a = 0 \text{ amp,}$$

$$i_b = (x_b)/[(x_b)^2 + (1-x_b)^2] \text{ amp, and}$$

$$i_c = (1-x_b)/[(x_b)^2 + (1-x_b)^2] \text{ amp;}$$

(c) For the center position (such as shown in FIG. 3C) (with $x_a=0$, $x_b=1$, and $x_c=0$), $i_b$ was 1 amp, and is and is were each 0 amp;

(d) For a positive displacement having a split between a portion of segment 202a in the gap ($x_a$) and a portion of segment 202b in the gap ($x_b$) (with $x_a=1-x_b$, and $x_c=0$)

$$I_a = (1-x_b)/[(x_b)^2 + (1-x_b)^2] \text{ amp,}$$

$$i_b = (x_b)/[(x_b)^2 + (1-x_b)^2] \text{ amp, and}$$

$$i_c = 0 \text{ amp; and}$$

(e) For the full positive position (such as shown in FIG. 3E) (with $x_a=1$, $x_b=0$, and $x_c=0$), is was 1 amp, and $i_b$ and $i_c$ were each 0 amp.

Figure 4B:
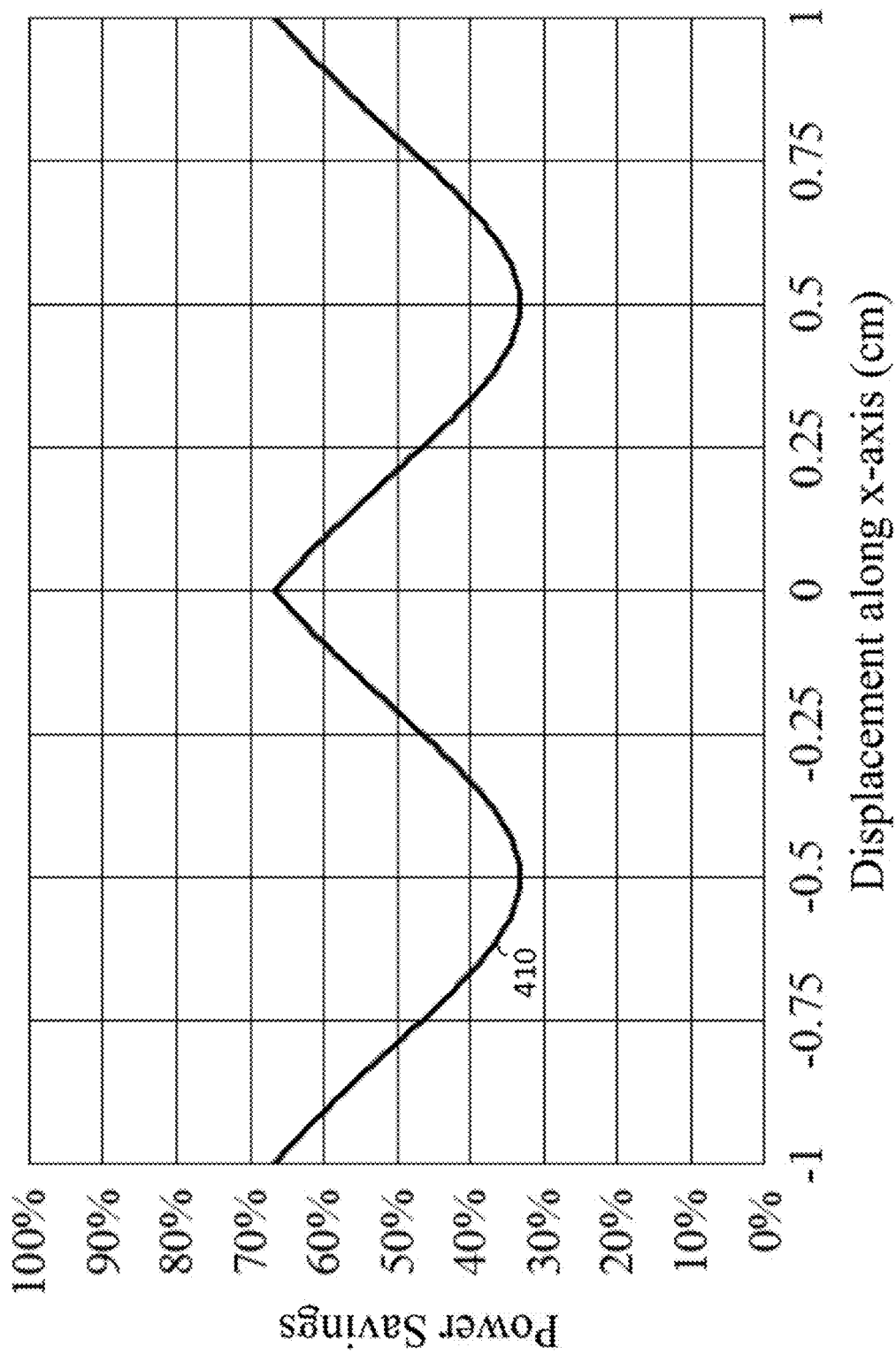
FIG. 4B is a graph showing a comparison of the power savings versus displacement along then x-direction for the voice coil actuator shown in FIG. 2.

FIG. 4B shows a comparison of the power savings versus displacement along then x-direction for the voice coil actuator shown in FIG. 2 (with the currents to sections 202a-202c as discussed above), as compared with the same voice coil actuator, except that all sections have the same current applied (which is consistent with Comparative Example B). Curve 410 shows that the power saving fluctuates between the full negative position and the full positive position resulting in power savings between 66.7% (such as the center position shown in FIG. 3C) to 33.3% (such as at the 50/50 split position shown in FIG. 3B). This is a power ratio ranging between 1.5 and 3. The average power savings for displacement along the x-axis is around 48%, which is an average power ratio of around 2.

Furthermore, being able to use a small/light magnetic circuit is advantageous for a mobile speaker. In alternative embodiments, two or four voice-coil segments can be used to produce some or all of the same benefits and advantages.

Moreover, in some embodiments, one amplifier having two channels (which is common for stereo systems) can be used to independently drive two voice coil segments. Thus for a two voice coil segment system, one amplifier having two channels can be utilized, and for a four voice coil segment system, two amplifiers, each having two channels can be utilized.

In still further embodiments, one amplifier can be utilized in combination with some low cost field effect transistors to switch between two to four voice coil segments. Such design, like the prior designs, requires feedback from a position sensor to work well. I.e., using four coils with multiple amplifiers in place of one coil and one amplifier is more efficient.

Figure 5:
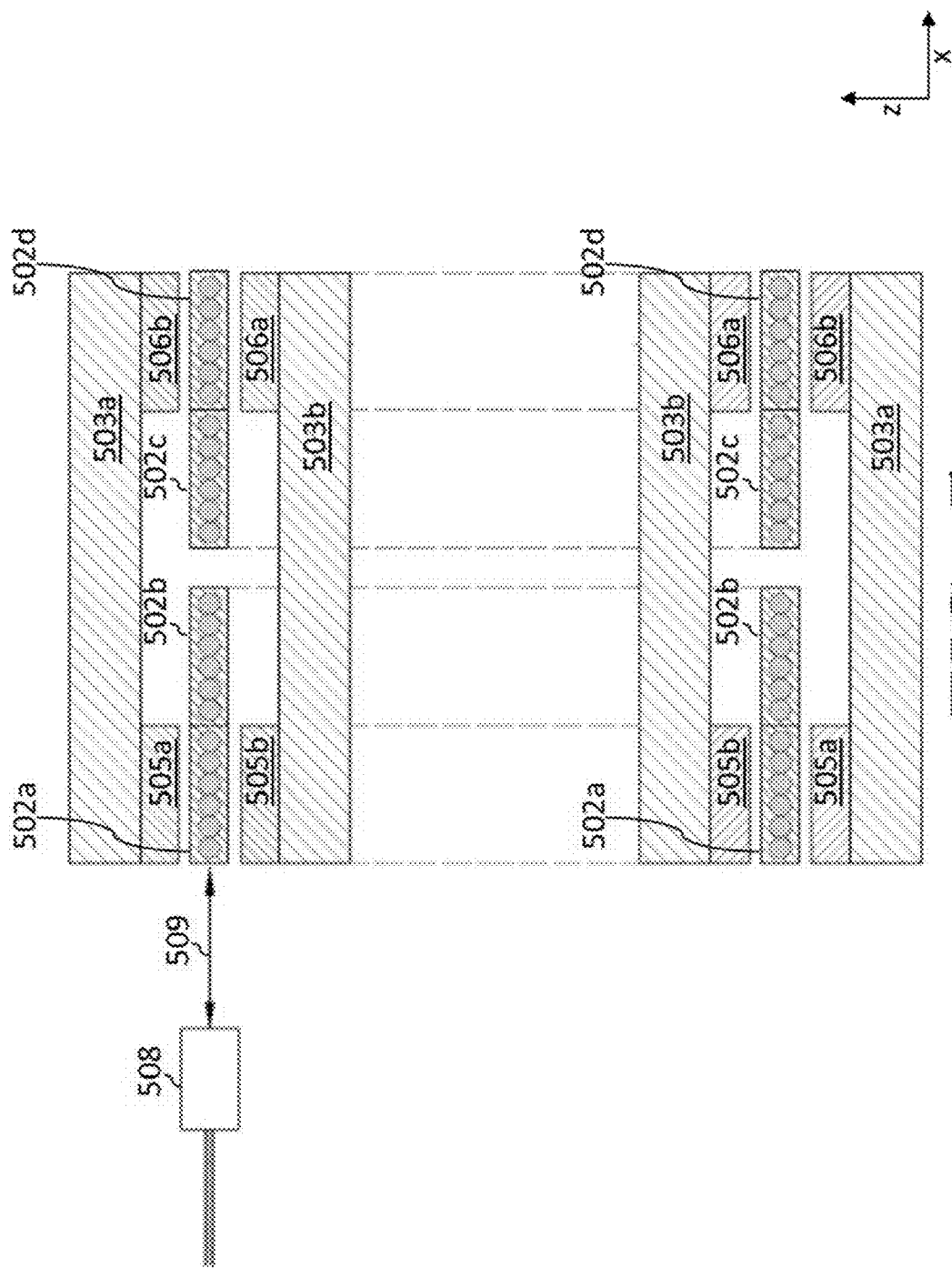
FIG. 5 is an illustration of another voice coil actuator of the present invention that can be utilized in a loudspeaker.

FIG. 5 is an illustration of a voice coil actuator with four voice coil segments 502a-502d. The voice coil actuator further includes permanent magnets 505a-505b and 506a-506b, and iron (or other metal) material 503a-503b. Similar to the voice coil actuator shown in FIG. 2, a position sensor 508 can be used to measure distance 509 and an amplifier can be independently operatively connected to and controlling the current to voice coil sections 502a-502d. With regard to the amplifier, two stereo amplifiers (each amplifier having two channels) that result in having four channels total (one channel for each section).

The voice coil actuator has two gaps, with the first gap between permanent magnets 505a-505b (which are of different polarity from each other) and the second gap between permanent magnets 506a-506b (which are of different polarity from each other). Moreover, permanent magnets 505a and 506a have the same polarity with one another and are different from the polarity of permanent magnets 505b and 506b (which have the same polarity as one another). I.e., permanent magnets 505a and 506a are positive while permanent magnets 505b and 506b are negative, or vice versa.

In a standard over-hung voice coil design, the voice coil would be driven with one amplifier. If the segments 502a-502d are voice coils that are each one meter in length (Example C), this is comparable to a combined voice coil having a total length of 4 meters (Comparative Example D). If these coil segments were to be controlled by one amplifier (one channel) and the magnetic field density in the air-gaps was 1 T, this would require a current of 0.5 amps in each segment and would produce 1 Newton of force. If the moving voice coil assembly is positioned at the "center position" (similar to as shown in FIG. 5 and FIG. 6C), only voice coil segments 502a and 502d would be immersed in the respective magnetic fields in the first gap (between permanent magnets 505a-505b) and the second gap (between permanent magnets 506a-506b). Thus only voice coil segments 502a and 502d produce force. Each voice coil segments 502a-502d will burn 0.25 W of power so all four will burn 1 W assuming the resistance of each coil is one ohm (when driven with one amplifier having one channel).

In the voice coil actuator of the present invention shown in FIG. 5 (having four channels, with one for each of voice coil segments 502a-502d) only voice coil segments 502a and 502d would be carrying 0.5 amps of current each (with voice coil segments 502b and 502c carrying zero amps) and so the total power is reduced by a factor of two to 0.5 W under the same conditions. Further information is shown in TABLE IV.

TABLE IV

| (Example C at center position shown in FIG. 6C) | |
|---|---|
| Current in segment 502a | 0.5 amp |
| Current in segment 502b | 0 amp |
| Current in segment 502c | 0 amp |
| Current in segment 502d | 0.5 amp |
| Fraction immersion of segment 502a in gaps | 100% |
| Fraction immersion of segment 502b in gaps | 0% |
| Fraction immersion of segment 502c in gaps | 0% |
| Fraction immersion of segment 502d in gaps | 100% |
| Magnetic Field Density in gaps | 1 T |
| Resistance of segment 502a | 1 ohm |
| Resistance of segment 502b | 1 ohm |
| Resistance of segment 502c | 1 ohm |

TABLE IV-continued (Example C at center position shown in FIG. 6C)

| | |
|---|---|
| Resistance of segment 502d | 1 ohm |
| Power of segment 502a | 0.25 W |
| Power of segment 502b | 0 W |
| Power of segment 502c | 0 W |
| Power of segment 502d | 0.25 W |
| Total power (of segments 502a-502d) | 0.5 W |
| Power Ratio with Comparative Example D (1 W) | 2 |

Figure 6A:
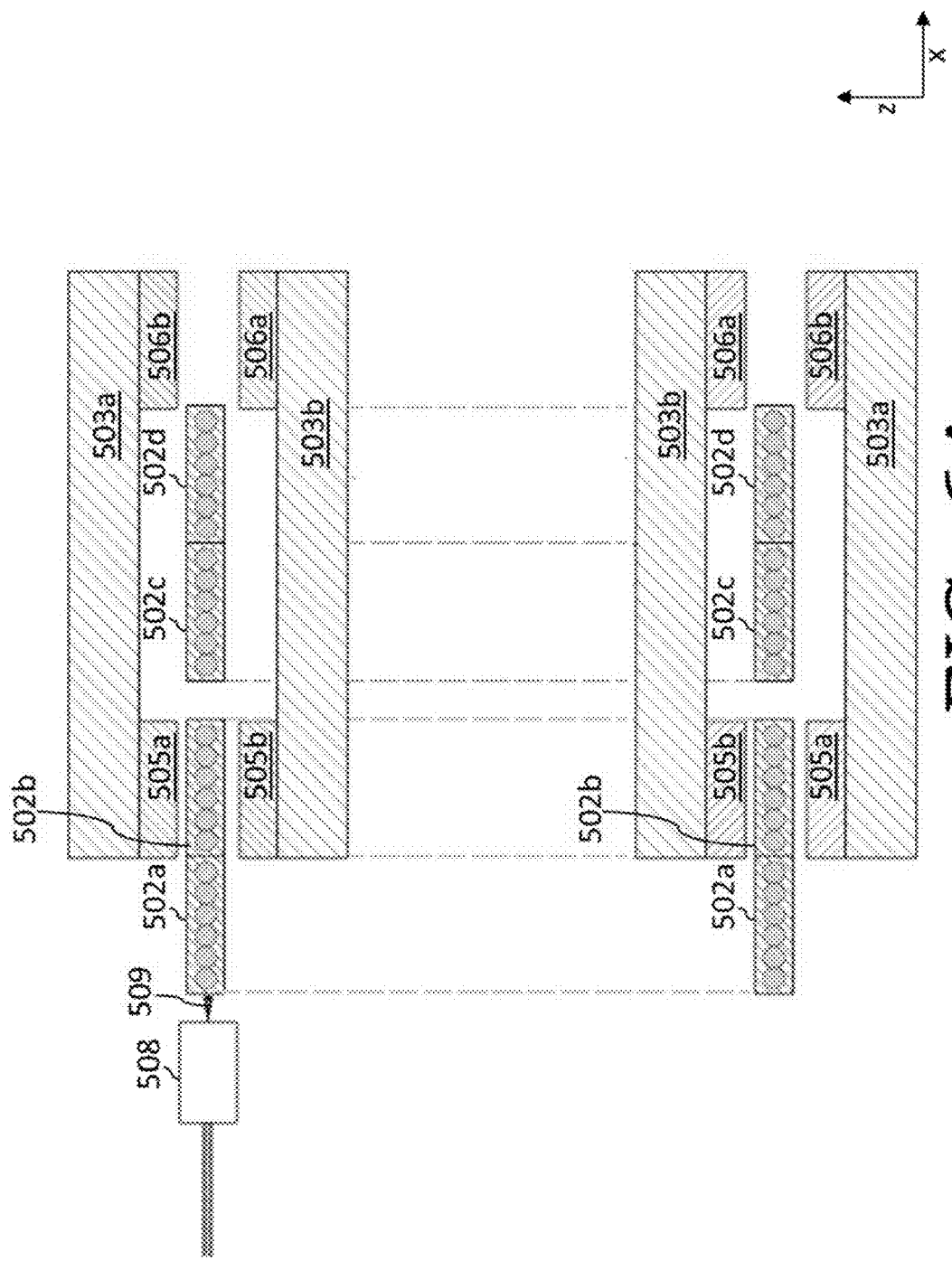
FIGS. 6A-6E are illustrations of the voice coil actuator shown in FIG. 5, showing the moving voice coil assembly at different positions along the x-axis direction.
Figure 6B:
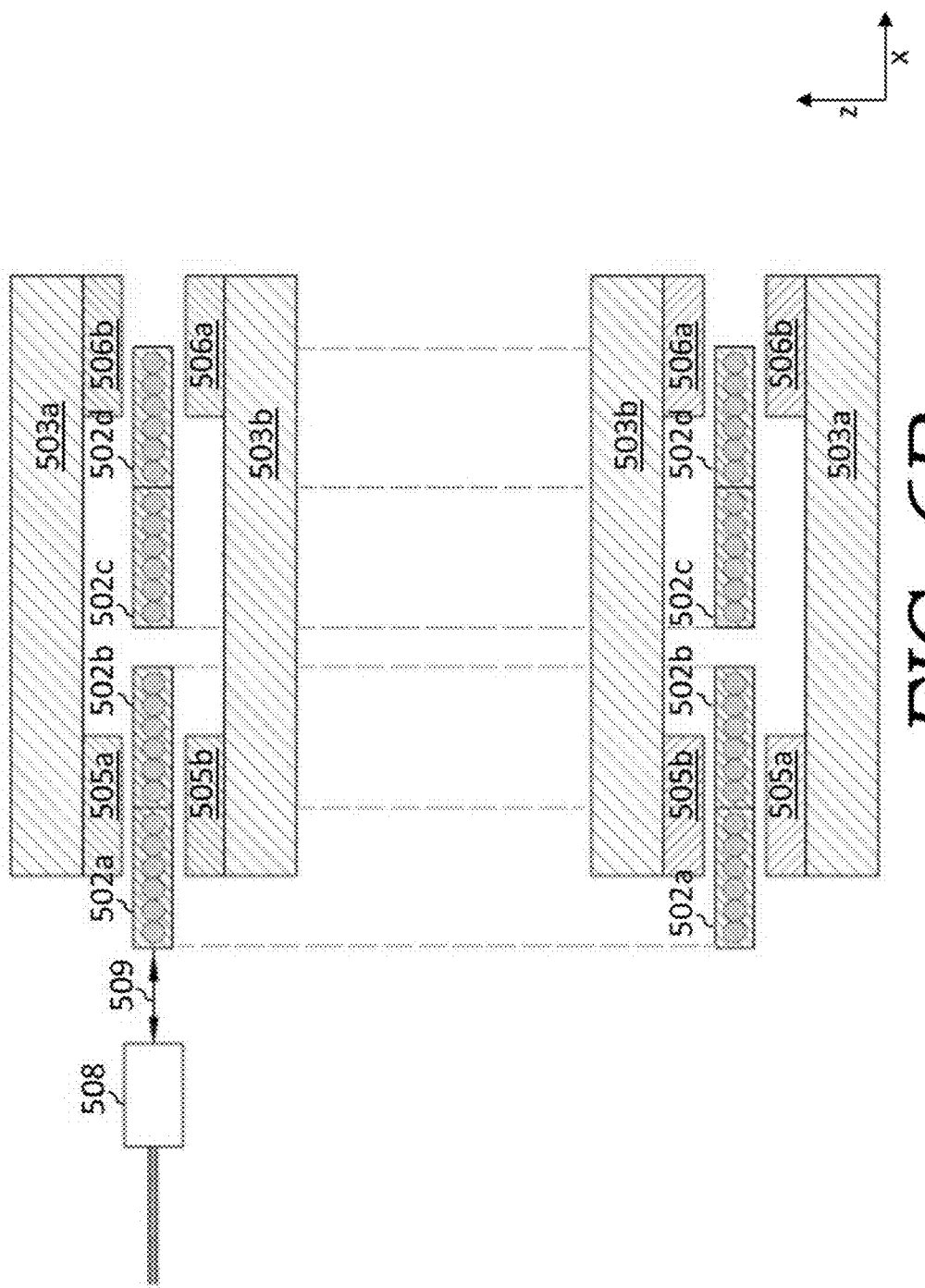
Figure 6C:
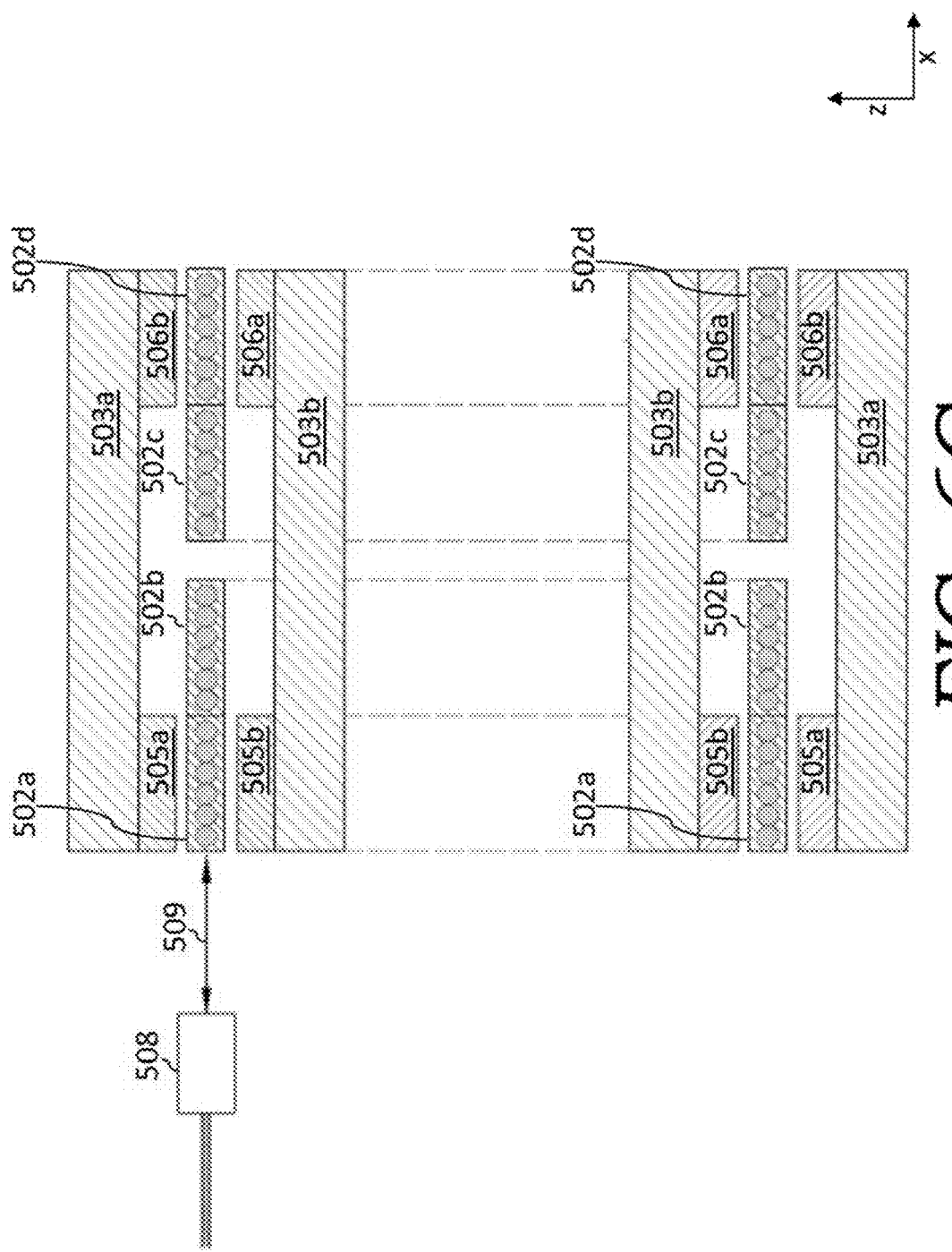
Figure 6D:
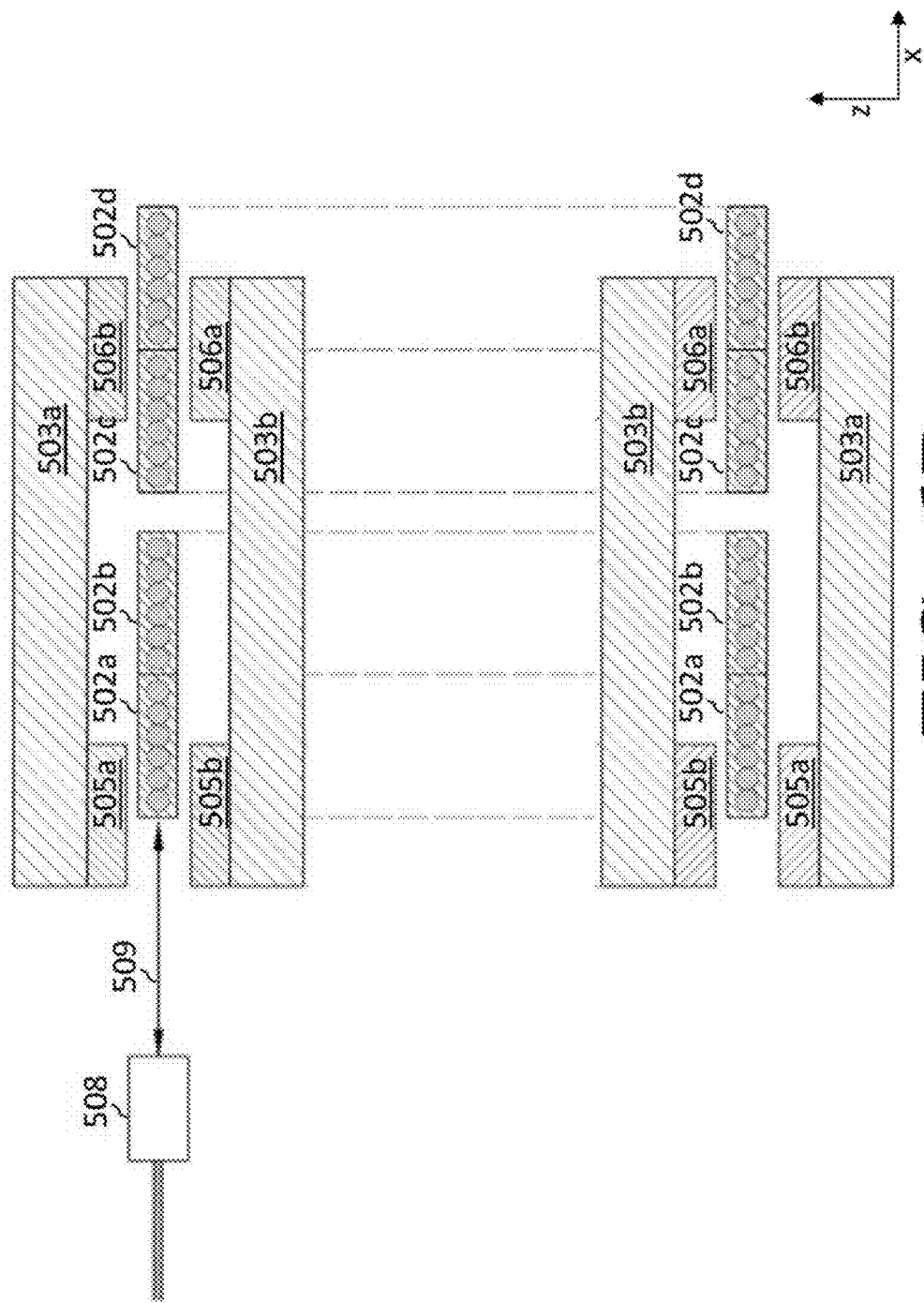
Figure 6E:
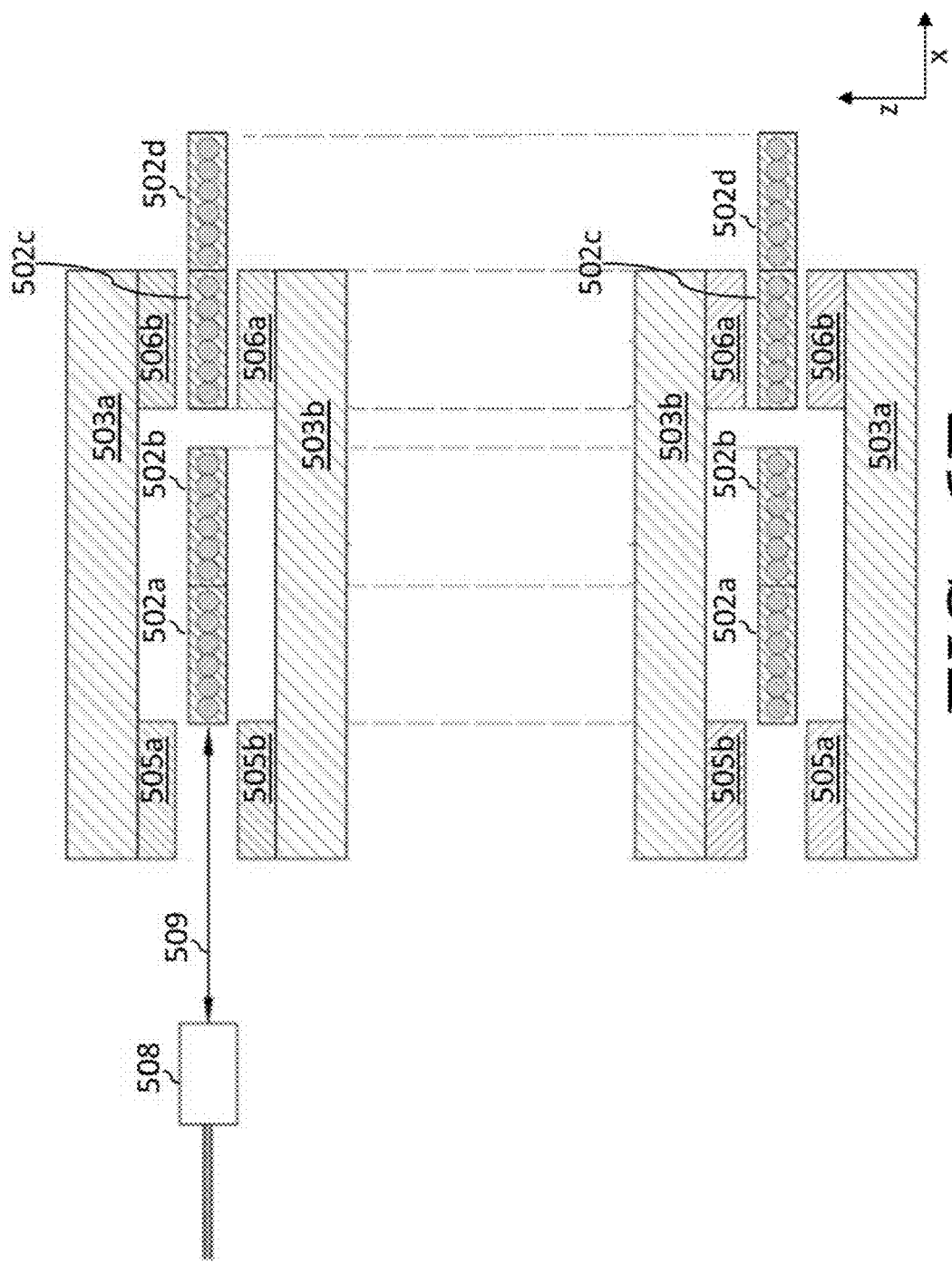

When the moving voice coil assembly is positioned one magnet length from the center position (as measured by the position sensor 508) in the positive x-axis direction (the "full positive position"), as shown in FIG. 6E, only voice coil segment 502c is immersed in the magnetic field (specifically the magnetic field in the second gap between permanent magnets 506a-506b). Again, under the same conditions as discussed above (Example C), to produce 1 N of force, voice coil segment 502c would carry 1 amp, which burns 1 W of power. In a conventional system, all four segments would be carrying 1 amp (even though voice coil segments 502a-502b and 502d are not immersed in the magnetic field and thus do not produce any force) and so the total power burned would be 4 W (which is four times higher than the embodiment shown in FIG. 6E). Further information is shown in TABLE V.

TABLE V (Example C at full positive position shown in FIG. 6E)

| | |
|---|---|
| Current in segment 502a | 0 amp |
| Current in segment 502b | 0 amp |
| Current in segment 502c | 1 amp |
| Current in segment 502d | 0 amp |
| Fraction immersion of segment 502a in gaps | 0% |
| Fraction immersion of segment 502b in gaps | 0% |
| Fraction immersion of segment 502c in gaps | 100% |
| Fraction immersion of segment 502d in gaps | 0% |
| Magnetic Field Density in gaps | 1 T |
| Resistance of segment 502a | 1 ohm |
| Resistance of segment 502b | 1 ohm |
| Resistance of segment 502c | 1 ohm |
| Resistance of segment 502d | 1 ohm |
| Power of segment 502a | 0 W |
| Power of segment 502b | 0 W |
| Power of segment 502c | 1 W |
| Power of segment 502d | 0 W |
| Total power (of segments 502a-502d) | 1 W |
| Power Ratio with Comparative Example D (4 W) | 4 |

FIG. 6A shows the moving voice coil assembly in the "full negative position," which is when the moving voice coil assembly is positioned one magnet length from the center position in the negative x-axis direction. In that position, only voice coil segment 502b is immersed in the magnetic field (specifically the magnetic field in the first gap between permanent magnets 505a-505b). Again, under the same conditions as discussed above, to produce 1 N of force, voice coil segment 502b would carry 1 amp, which burns 1 W of power. Thus, this too has exhibits the same efficiency advantage of four times less as compared with a conventional system.

FIG. 6D shows the moving voice coil assembly in a position halfway between the center position and the full positive position (which is when the moving voice coil assembly is positioned one-half magnet length from the center position in the positive x-axis direction). In this position, one-half of voice coil segment 502a is within the first gap, one half of each of voice coil segments 502c-502d are within the second gap, and voice coil segment 502b is outside of both gaps. Thus, voice coil segment 502b can carry zero amps, while each of the other voice coils would then have 0.67 amps, which burns 0.44 W of power, so again, the total power is reduced by a factor of 1.33 under the same conditions for a conventional system. Further information is shown in TABLE VI.

TABLE VI (Example C at split position shown in FIG. 6D)

| | |
|---|---|
| Current in segment 502a | 0.67 amp |
| Current in segment 502b | 0 amp |
| Current in segment 502c | 0.67 amp |
| Current in segment 502d | 0.67 amp |
| Fraction immersion of segment 502a in gaps | 50% |
| Fraction immersion of segment 502b in gaps | 0% |
| Fraction immersion of segment 502c in gaps | 50% |
| Fraction immersion of segment 502d in gaps | 50% |
| Magnetic Field Density in gaps | 1 T |
| Resistance of segment 502a | 1 ohm |
| Resistance of segment 502b | 1 ohm |
| Resistance of segment 502c | 1 ohm |
| Resistance of segment 502d | 1 ohm |
| Power of segment 502a | 0.44 W |
| Power of segment 502b | 0 W |
| Power of segment 502c | 0.44 W |
| Power of segment 502d | 0.44 W |
| Total power (of segments 502a-502d) | 1.33 W |
| Power Ratio w/Comparative Example D (1.77 W) | 2 |

FIG. 6B shows the moving voice coil assembly in a position halfway between the full negative position and the center position (which is when the moving voice coil assembly is positioned one-half magnet length from the center position in the negative x-axis direction). In this position, one-half of each of voice coil segments 502a-502b are within the first gap, one half of voice coil segment 502d is within the second gap, and voice coil segment 502c is outside of both gaps. For similar reason as discussed above for FIG. 6D, the total power is reduced by a factor of 2 under the same conditions for a conventional system.

The efficiency advantage throughout these positions (from the full negative position to the full positive position) is between 1.3 to 4 times (i.e., the average force per unit power burned advantage of the present invention is between 1.3 to 4 times as compared to conventional voice coil actuator systems). Less power burned in the voice coils also means less heating (which is the limiting factor for maximum sound pressure level a voice coil actuator can produce) and so allows the voice coil actuator of the present invention to produce a higher level of sound pressure if desired.

Figure 7A:
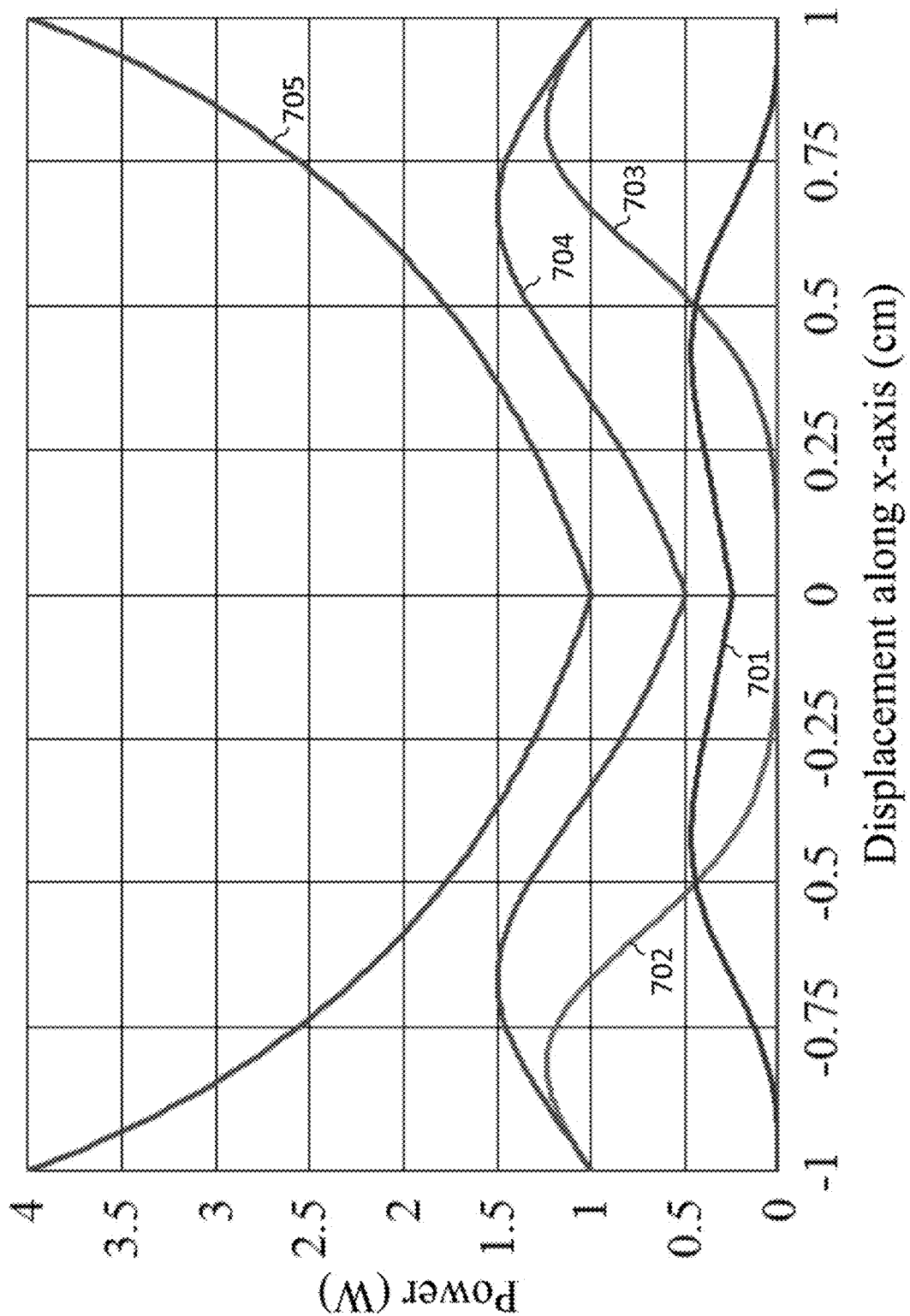
FIG. 7A is a graph showing power curves versus displacement along then x-direction for the voice coil actuator shown in FIG. 5.

FIG. 7A shows power curves versus displacement along then x-direction for the voice coil actuator shown in FIG. 5. The conditions are the same as those described above for Example C and Comparative Example D. Curve 701 shows the power curves for segments 502a and 502d (which by symmetry are the same curve). Curves 702-703 show the power curves for segments 502b-502c, respectively. Curve 704 is the total power (i.e., the sum of power curves 701-703, with power curve counted twice, since it applied to both segments 502a and 502d). Curve 705 is the total power for the voice actuator shown in FIG. 5, except that all sections have the same current applied (which is consistent with Comparative Example D). In the embodiment of FIG. 5 (with currents independently applied to sections 502a-502d), the current applied to segments 502a-502d ($i_a$, $i_b$, $i_c$, and $i_d$, respectively) were as follows (with the amount of immersion of sections 502a-502cd being designated as $x_a$, $x_b$, $x_c$, and $x_d$, respectively) to minimize power:

$$i_a = x_a/((x_a)^2 + (x_b)^2 + (x_c)^2 + (x_d)^2)$$

$$i_b = x_b/((x_a)^2 + (x_b)^2 + (x_c)^2 + (x_d)^2)$$

$$i_c = x_c/((x_a)^2 + (x_b)^2 + (x_c)^2 + (x_d)^2)$$

$$i_d = x_d/((x_a)^2 + (x_b)^2 + (x_c)^2 + (x_d)^2)$$

These equations can be simplified in the various positions as follows:

(a) For the full negative position (such as shown in FIG. 6A) (with $x_a=0$, $x_b=1$, $x_c=0$, and $x_d=0$), $i_b$ was 1 amp, and $i_a$, $i_c$, and $i_d$ were each 0 amp;

(b) For a negative displacement having a split between a portion of segment 502a in the first gap ($x_a$), a portion of segment 502b in the first gap ($x_b$), and a portion of segment 502d in the second gap ($x_d$) (with $x_b=1-x_a$, $x_c=0$ and $x_d=x_a$)

$$i_a = (x_a)/[2(x_a)^2 + (1-x_a)^2] \text{ amp,}$$

$$i_b = (1-x_a)/[2(x_a)^2 + (1-x_a)^2] \text{ amp,}$$

$$i_c = 0 \text{ amp, and}$$

$$i_d = (x_a)/[2(x_a)^2 + (1-x_a)^2] \text{ amp;}$$

(c) For the center position (such as shown in FIG. 6C) (with $x_a=1$, $x_b=0$, $x_c=0$, and $x_d=1$), $i_a$ and $i_d$ were each 0.5 amp, and $i_b$ and $i_c$ were each 0 amp;

(d) For a positive displacement a split between a portion of segment 502a in the first gap ($x_a$), a portion of segment 502c in the second gap ($x_c$), and a portion of segment 502d in the second gap ($x_d$) (with $x_b=0$, $x_c=1-x_a$, and $x_d=x_a$)

$$i_a = (x_a)/[2(x_a)^2 + (1-x_a)^2] \text{ amp,}$$

$$i_b = 0 \text{ amp, and}$$

$$i_c = (1-x_a)/[2(x_a)^2 + (1-x_a)^2] \text{ amp, and}$$

$$i_d = (x_a)/[2(x_a)^2 + (1-x_a)^2] \text{ amp; and}$$

(e) For the full positive position (such as shown in FIG. 6E) (with $x_a=0$, $x_b=0$, $x_c=1$, and $x_d=0$), $i_s$ was 1 amp, and $i_a$, $i_b$, and $i_d$ were each 0 amp.

It should be noted that, when $i_d=i_a$ for all positions (from the full negative position to the full positive position), such as shown in the above power minimizing equations discussed above, the current for sections 502a and 502d can be amplified utilizing the same channel of the same amplifier.

Figure 7B:
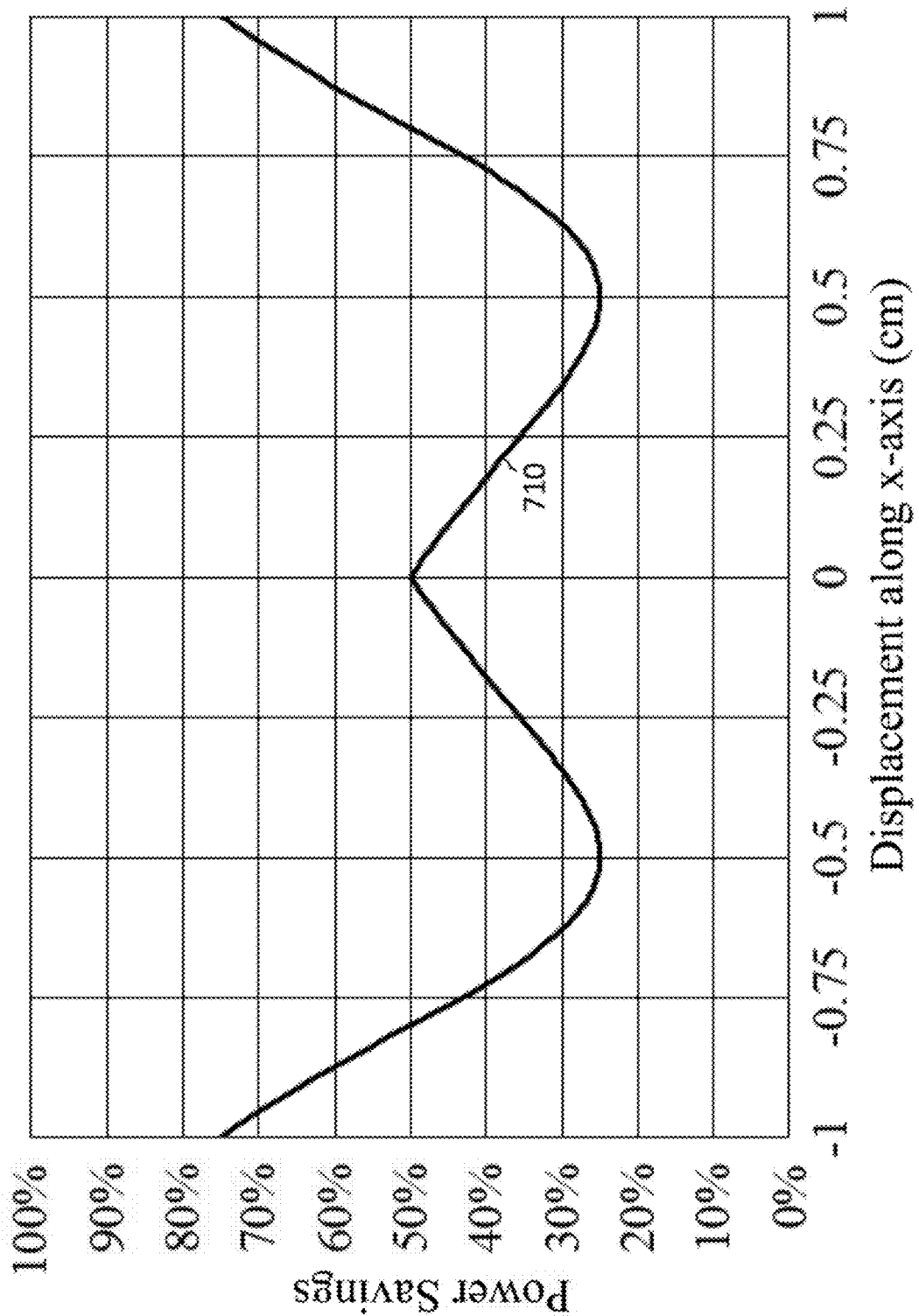
FIG. 7B is a graph showing a comparison of the power savings versus displacement along then x-direction for the voice coil actuator shown in FIG. 5.

FIG. 7B shows a comparison of the power savings versus displacement along then x-direction for the voice coil actuator shown in FIG. 5 (with the currents to sections 502a-502d as discussed above), as compared with the same voice coil actuator, except that all sections have the same current applied (which is consistent with Comparative Example D). Curve 710 shows that the power saving fluctuates between the full negative position and the full positive position resulting in power savings between 25% (such as the position shown in FIG. 6B) to 75% (such as at the full negative position shown in FIG. 7A). This is a power ratio ranging between 1.33 to 4. The average power savings for displacement along the x-axis is around 45%, which is an average power ratio of around 1.8.

Similar to as discussed above with respect to the embodiment of FIG. 2, alternative embodiments can be implemented that adjust the currents in segments 502-502d.

Moreover, in further embodiments, it is possible to reduce power nearly a factor of 3 if more coil segments are used.

The voice coil actuators of the present invention can be utilized in conventional loudspeakers as well as other loudspeaker devices, such as the devices disclosed and described in the Pinkerton '313 Patent, the Badger PCT '871 Patent Application, and the Pinkerton PCT '633 Patent Application. Moreover, the voice coil actuators of the present invention can be used for applications other than loudspeakers, where time force linearity and long strokes are needed. Some environments like the vacuum of space require specific attention during conception, in order to evaluate coil losses. Several specific methods described above can be used to minimize these coil losses.

For instance, a music file signal/current that could be fed into a conventional over-hung voice coil can be converted into a total current value required for the segmented voice coil assembly of the present invention. In embodiments of the present invention such as shown in FIG. 2, such conversion equation can be performed utilizing the following equation:

$$i_a + i_b + i_c = i/[(x_f)^2 + (1-x_f)^2)],$$

where $i$ is the conventional voice coil current and $x_f$ is the fraction of the conventional voice coil that is immersed in the magnetic field (i.e., for Comparable Example B, i was 1 amp and $x_f$ was ⅓). Once $i_a + i_b + i_c$ is determined utilizing this equation, the currents $i_a$, $i_b$, and $i_c$ can then be individually amplified to their respective components in amounts similar to as described above, such as by using the power minimization equations discussed above.

Moreover, it is further advantageous in terms of power consumption to route all the current in one voice coil segment when first turning on a reluctance assist driver (RAD)/magnetic negative spring (MNS) device (such as described in the Pinkerton PCT '633 Patent Application), which will center the armature of the voice coil actuator. (Generally, the armature will be forced to the full negative position or the full positive position when the speaker is turned off).

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

Amounts and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a numerical range of approximately 1 to approximately 4.5 should be interpreted to include not only the explicitly recited limits of 1 to approximately 4.5, but also to include individual numerals such as 2, 3, 4, and sub-ranges such as 1 to 3, 2 to 4, etc. The same principle applies to ranges reciting only one numerical value, such as "less than approximately 4.5," which should be interpreted to include all of the above-recited values and ranges. Further, such an interpretation should apply regardless of the breadth of the range or the characteristic being described.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

Following long-standing patent law convention, the terms "a" and "an" mean "one or more" when used in this application, including the claims.

Unless otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties sought to be obtained by the presently disclosed subject matter.

As used herein, the term "about" and "substantially" when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, the term "substantially perpendicular" and "substantially parallel" is meant to encompass variations of in some embodiments within ±10° of the perpendicular and parallel directions, respectively, in some embodiments within ±5° of the perpendicular and parallel directions, respectively, in some embodiments within ±1° of the perpendicular and parallel directions, respectively, and in some embodiments within ±0.5° of the perpendicular and parallel directions, respectively.

As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

What is claimed is:

1. A loudspeaker comprising:
  (a) a sealed enclosure;
  (b) a sound panel mechanically connected to the sealed enclosure;
  (c) a voice coil actuator operable to convert electrical energy into mechanical energy for movement of the sound panel, wherein
    (i) the voice coil actuator comprises a plurality of voice coil segments;
  (d) one or more amplifiers, wherein
    (i) each voice coil segment in the plurality of voice coil segments is operatively connected to an amplifier in the one or more amplifiers for applying segment current to the voice coil segment, and
    (ii) the one or more amplifiers comprises at least one amplifier having two channels that can independently control the application of current in two different voice coil segments in the plurality of voice coil segments; and
  (e) a position sensor that senses the position of one or more of the sound panel and the voice coil actuator, wherein
    (i) the segment current applied to each voice coil segment is independently controlled by the amplifier operatively connected thereto based upon the position sensed by the position sensor.

2. The loudspeaker of claim 1 further comprising one or more stationary magnets that define one or more stationary magnet gaps, wherein
  (a) the plurality of voice coil segments comprises i number of voice coil segments;
  (b) the voice coil actuator is operable to move the voice coil segments to change fractional portions of the voice coil segments within the one or more stationary magnet gaps, wherein
    (i) the fractional portions for the i number of voice coil segments within the one or more stationary magnet gaps are voice coil segment fractions $x_1$ though $x_i$, respectively, and
    (ii) each of voice coil segment fractions $x_1$ though $x_i$ is between 0 to 1, inclusive; and
  (c) the segment currents applied to the voice coil segments are operatively controlled by one or more amplifiers based upon the voice coil segment fractions $x_1$ though $x_i$ at the position sensed by the position sensor.

3. A loudspeaker comprising:
  (a) a sealed enclosure;
  (b) a sound panel mechanically connected to the sealed enclosure;
  (c) a voice coil actuator operable to convert electrical energy into mechanical energy for movement of the sound panel, wherein
    (i) the voice coil actuator comprises a plurality of voice coil segments;
  (d) one or more amplifiers, wherein each voice coil segment in the plurality of voice coil segments is operatively connected to an amplifier in the one or more amplifiers for applying segment current to the voice coil segment;
  (e) a position sensor that senses the position of one or more of the sound panel and the voice coil actuator, wherein
    (i) the segment current applied to each voice coil segment is independently controlled by the amplifier operatively connected thereto based upon the position sensed by the position sensor;
  (f) one or more stationary magnets that define one or more stationary magnet gaps, wherein
    (i) the plurality of voice coil segments comprises i number of voice coil segments;
    (ii) the voice coil actuator is operable to move the voice coil segments to change fractional portions of the voice coil segments within the one or more stationary magnet gaps, wherein (A) the fractional portions for the i number of voice coil segments within the one or more stationary magnet gaps are voice coil segment fractions $x_1$ though $x_i$, respectively, and
(B) each of voice coil segment fractions $x_1$ though $x_i$ is between 0 to 1, inclusive; and
(iii) the segment currents applied to the voice coil segments are operatively controlled by one or more amplifiers based upon the voice coil segment fractions $x_1$ though $x_i$ at the position sensed by the position sensor, wherein
(A) the segment currents applied to each of the voice coil segments 1 through i, are, respectively, $i_j$ with $$i_j = \left\{ Kx_j / \left[ \sum_{k=1}^{i} (x_k)^2 \right] \right\} \pm 10\%;$$

(B) K is based upon a magnetic force to be created by the voice coil segments; and
(C) j is an integer from 1 to i.

4. The loudspeaker of claim 3, wherein $$i_j = \left\{ Kx_j / \left[ \sum_{k=1}^{i} (x_k)^2 \right] \right\} \pm 5\%.$$

5. The loudspeaker of claim 3, wherein $$i_j = \left\{ Kx_j / \left[ \sum_{k=1}^{i} (x_k)^2 \right] \right\}.$$

6. The loudspeaker of claim 3, wherein K is based upon the magnetic force to be created for application at the position sensed by the position sensor.

7. The loudspeaker of claim 3, wherein K is a constant.

8. The loudspeaker of claim 2, wherein i is between 2 and 6.

9. The loudspeaker of claim 8, wherein i is between 3 and 4.

10. The loudspeaker of claim 2, wherein, in at least some positions sensed by the position sensor, at least some, but not all, of the voice coil segments have voice coil segments fractions $x_1$ though $x_i$ that are 0.

11. The loudspeaker of claim 2, wherein the one or more stationary magnets can be one or more permanent magnets.

12. The loudspeaker of claim 1, wherein the position sensor is selected from a group consisting of infrared position sensors, capacitive position sensors, inductive position sensor, and combinations thereof.

13. The loudspeaker of claim 1, wherein the one or more amplifiers is one amplifier having two channels.

14. The loudspeaker of claim 1, wherein the one or more amplifiers comprises at least two amplifiers with each having two channels.

15. A method of using a loudspeaker comprising:
(a) selecting a loudspeaker comprising
(i) a sealed enclosure,
(ii) a sound panel mechanically connected to the sealed enclosure,
(iii) a voice coil actuator, wherein the voice coil comprises a plurality of voice coil segments,
(iv) one or more amplifiers, wherein
(A) the one or more amplifiers comprises at least one amplifier having two channels, and
(v) a position sensor;
(b) utilizing the voice coil actuator to move the sound panel;
(c) utilizing the position sensor to sense the position of one or more of the sound panel and the voice coil actuator; and
(d) utilizing the one or more amplifiers to independently apply a plurality of segment currents, wherein
(i) each segment current in the plurality of segment currents is applied to a respective voice coil segment in the plurality of voice coil segments,
(ii) amounts of each segment current in the plurality of segment currents are varied based upon the position sensed by the position sensor, and
(iii) the utilizing of the one or more amplifiers comprises using the amplifier having two channels to independently apply current in two different voice coil segments in the plurality of voice coil segments.

16. The method of claim 15, wherein
(a) the loudspeaker further comprises one or more stationary magnets that define one or more stationary magnet gaps;
(b) the plurality of voice coil segments comprises i number of voice coil segments;
(c) movement of the voice coil actuator moves the voice coil segments to change fractional portions of the voice coil segments within the one or more stationary magnet gaps, wherein
(i) the fractional portions for the i number of voice coil segments within the one or more stationary magnet gaps are voice coil segment fractions $x_1$ though $x_i$, respectively, and
(ii) each of voice coil segments fractions $x_1$ though $x_i$ is between 0 to 1, inclusive; and
(d) the amounts of each segment current applied by the one or more amplifiers are varied based upon the voice coil segments fractions $x_1$ though $x_i$ at the position sensed by the position sensor.

17. A method comprising:
(a) selecting a loudspeaker comprising
(i) a sealed enclosure,
(ii) a sound panel mechanically connected to the sealed enclosure,
(iii) a voice coil actuator, wherein the voice coil comprises a plurality of voice coil segments,
(iv) one or more amplifiers, and
(v) a position sensor;
(b) utilizing the voice coil actuator to move the sound panel;
(c) utilizing the position sensor to sense the position of one or more of the sound panel and the voice coil actuator; and
(d) utilizing the one or more amplifiers to independently apply a plurality of segment currents, wherein
(i) each segment current in the plurality of segment currents is applied to a respective voice coil segment in the plurality of voice coil segments,
(ii) Amounts of each segment current in the plurality of segment currents are varied based upon the position sensed by the position sensor,
(iii) the loudspeaker further comprises one or more stationary magnets that define one or more stationary magnet gaps,
(iv) the plurality of voice coil segments comprises i number of voice coil segments,
(v) movement of the voice coil actuator moves the voice coil segments to change fractional portions of the voice coil segments within the one or more stationary magnet gaps, wherein
  (A) the fractional portions for the i number of voice coil segments within the one or more stationary magnet gaps are voice coil segment fractions $x_1$ though $x_i$, respectively, and
  (B) each of voice coil segments fractions $x_1$ though $x_i$ is between 0 to 1, inclusive; and
(vi) the amounts of each segment current applied by the one or more amplifiers are varied based upon the voice coil segments fractions $x_1$ though $x_i$ at the position sensed by the position sensor, wherein
  (A) the segment currents applied to each of the voice coil segments 1 through i, are, respectively, $i_j$ with $i_j = \left\{ Kx_j / \left[ \sum_{k=1}^{i} (x_k)^2 \right] \right\} \pm 10\%;$ (B) K is based upon a magnetic force to be created by the voice coil segments; and
  (C) j is an integer from 1 to i.

18. The method of claim 17, wherein $i_j = \left\{ Kx_j / \left[ \sum_{k=1}^{i} (x_k)^2 \right] \right\} \pm 5\%.$

19. The method of claim 17, wherein $i_j = \left\{ Kx_j / \left[ \sum_{k=1}^{i} (x_k)^2 \right] \right\}.$

20. The method of claim 17, wherein K is based upon the magnetic force created for application at the position sensed by the position sensor.

21. The method of claim 17, wherein K is a constant.

22. The method of claim 16, wherein i is between 2 and 6.

23. The method of claim 22, wherein i is between 3 and 4.

24. The method of claim 16, wherein, in at least some positions sensed by the position sensor, at least some, but not all, of the voice coil segments have voice coil segments fractions $x_1$ though $x_i$ that are 0.

25. The method of claim 16, wherein the one or more stationary magnets can be one or more permanent magnets.

26. The method of claim 15, wherein the position sensor is selected from a group consisting of infrared position sensors, capacitive position sensors, inductive position sensor, and combinations thereof.

27. The method of claim 15, wherein the one or more amplifiers is one amplifier having two channels.

28. The method of claim 15, wherein the one or more amplifiers comprises at least two amplifiers with each having two channels.

* * * * *